US012621990B2

(12) United States Patent
Song et al.

(10) Patent No.: US 12,621,990 B2
(45) Date of Patent: May 5, 2026

(54) SPLIT GATE NON-VOLATILE MEMORY CELLS, HV AND LOGIC DEVICES WITH FINFET STRUCTURES, AND METHOD OF MAKING SAME

(71) Applicant: Silicon Storage Technology, Inc., San Jose, CA (US)

(72) Inventors: Guo Xiang Song, Shanghai (CN); Chunming Wang, Shanghai (CN); Leo Xing, Shanghai (CN); Xian Liu, Sunnyvale, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 232 days.

(21) Appl. No.: 18/103,265

(22) Filed: Jan. 30, 2023

(65) Prior Publication Data

US 2023/0189520 A1     Jun. 15, 2023

Related U.S. Application Data

(62) Division of application No. 17/152,441, filed on Jan. 19, 2021, now abandoned.

(30) Foreign Application Priority Data

Oct. 30, 2020     (CN) .......................... 202011193113.X

(51) Int. Cl.
*H10B 41/42*          (2023.01)
*H10B 41/30*          (2023.01)
(Continued)

(52) U.S. Cl.
CPC ............. *H10B 41/42* (2023.02); *H10B 41/30* (2023.02); *H10D 30/024* (2025.01);
(Continued)

(58) Field of Classification Search
CPC ...... H10B 41/42; H10B 41/30; H10D 30/024; H10D 30/0411; H10D 30/6211; H10D 84/0158; H10D 84/834
See application file for complete search history.

(56) References Cited

U.S. PATENT DOCUMENTS

| | | | |
|---|---|---|---|
| 5,029,130 A | 7/1991 | Yeh | |
| 6,747,310 B2 | 6/2004 | Fan | |
| (Continued) | | | |

FOREIGN PATENT DOCUMENTS

| | | |
|---|---|---|
| CN | 108022930 A | 5/2018 |
| EP | 3 293 756 | 3/2018 |
| (Continued) | | |

OTHER PUBLICATIONS

S. Korean Notice of Reason for Rejection mailed on Apr. 16, 2024 corresponding to the related S. Korean Patent Application No. 10-2023-7009233.

(Continued)

*Primary Examiner* — Tuan A Hoang
(74) *Attorney, Agent, or Firm* — DLA Piper LLP (US)

(57) ABSTRACT

A method of forming memory cells, high voltage devices and logic devices on fins of a semiconductor substrate's upper surface, and the resulting memory device formed thereby. The memory cells are formed on a pair of the fins, where the floating gate is disposed between the pair of fins, the word line gate wraps around the pair of fins, the control gate is disposed over the floating gate, and the erase gate is disposed over the pair of fins and partially over the floating gate. The high voltage devices include HV gates that wrap around respective fins, and the logic devices include logic gates that are metal and wrap around respective fins.

13 Claims, 25 Drawing Sheets

6

(51) Int. Cl.

| | |
|---|---|
| *H10D 30/01* | (2025.01) |
| *H10D 30/62* | (2025.01) |
| *H10D 30/68* | (2025.01) |
| *H10D 64/01* | (2025.01) |

(52) U.S. Cl.

CPC ..... *H10D 30/0411* (2025.01); *H10D 30/6211* (2025.01); *H10D 30/683* (2025.01); *H10D 30/6892* (2025.01); *H10D 64/017* (2025.01); *H10D 64/035* (2025.01)

(56) References Cited

U.S. PATENT DOCUMENTS

| | | | |
|---|---|---|---|
| 7,315,056 | B2 | 1/2008 | Klinger |
| 7,329,580 | B2 | 2/2008 | Choi |
| 7,410,913 | B2 | 8/2008 | Lee |
| 7,423,310 | B2 | 9/2008 | Verhoeven |
| 7,868,375 | B2 | 1/2011 | Liu |
| 7,927,994 | B1 | 4/2011 | Liu |
| 8,068,370 | B2 | 11/2011 | Lue |
| 8,148,768 | B2 | 4/2012 | Do et al. |
| 8,420,476 | B2 | 4/2013 | Booth, Jr. |
| 8,461,640 | B2 | 6/2013 | Hu |
| 8,710,485 | B2 | 4/2014 | Saitoh et al. |
| 8,941,153 | B2 | 1/2015 | Lee et al. |
| 9,276,005 | B1 | 3/2016 | Zhou |
| 9,276,006 | B1 | 3/2016 | Chen |
| 9,406,689 | B2 | 8/2016 | Li |
| 9,614,048 | B2 | 4/2017 | Wu |
| 9,634,018 | B2 | 4/2017 | Su |
| 9,972,630 | B2 | 5/2018 | Su et al. |
| 10,032,891 | B2 | 7/2018 | Baars |
| 10,312,247 | B1* | 6/2019 | Jourba ............... H10D 30/6892 |
| 10,468,428 | B1 | 11/2019 | Zhou et al. |
| 10,644,012 | B2 | 5/2020 | Jourba |
| 10,727,240 | B2 | 7/2020 | Jourba |
| 10,797,142 | B2 | 10/2020 | Jourba |
| 2005/0012137 | A1 | 1/2005 | Levi |
| 2005/0280000 | A1 | 12/2005 | Ishii |
| 2006/0097310 | A1 | 5/2006 | Kim |
| 2006/0208307 | A1 | 9/2006 | Chang |
| 2007/0158730 | A1 | 7/2007 | Burnett |
| 2008/0173921 | A1 | 7/2008 | Li |
| 2010/0320525 | A1 | 12/2010 | Nagashima |
| 2013/0270627 | A1 | 10/2013 | Cheng |
| 2015/0162339 | A1 | 6/2015 | Divakaruni |
| 2016/0064398 | A1 | 3/2016 | Toh |
| 2016/0218110 | A1 | 7/2016 | Yang et al. |
| 2016/0379987 | A1 | 12/2016 | Liu |
| 2017/0117285 | A1 | 4/2017 | Chen |
| 2017/0125429 | A1 | 5/2017 | Su et al. |
| 2017/0200726 | A1* | 7/2017 | Tsuda ................... H10D 64/017 |
| 2017/0243955 | A1 | 8/2017 | Shinohara |
| 2017/0271484 | A1 | 9/2017 | Baars et al. |
| 2017/0301683 | A1 | 10/2017 | Chen |
| 2017/0345840 | A1 | 11/2017 | Su et al. |
| 2019/0326305 | A1* | 10/2019 | Zhou ................... H10D 62/371 |
| 2020/0176459 | A1 | 6/2020 | Zhou et al. |
| 2021/0043638 | A1* | 2/2021 | Lin ................... H10D 30/6892 |

FOREIGN PATENT DOCUMENTS

| | | |
|---|---|---|
| JP | 2017 152541 A | 8/2017 |
| TW | 201926653 A | 7/2019 |

OTHER PUBLICATIONS

Japanese Notice of Reasons for Rejection mailed on Jul. 8, 2024 corresponding to the related Japanese Patent Application No. 2023-525482.

Li, et al., "Design Issues and Insights of Multi-fin Bulk Silicon FINFETS," Quality Electronic Design, 2012, 13th International Symposium On, IEEE, Mar. 19, 2012, pp. 723-726.

PCT Search Report and Written Opinion dated Jul. 21, 2021 corresponding to the related PCT Patent Application No. US2021/014245.

* cited by examiner

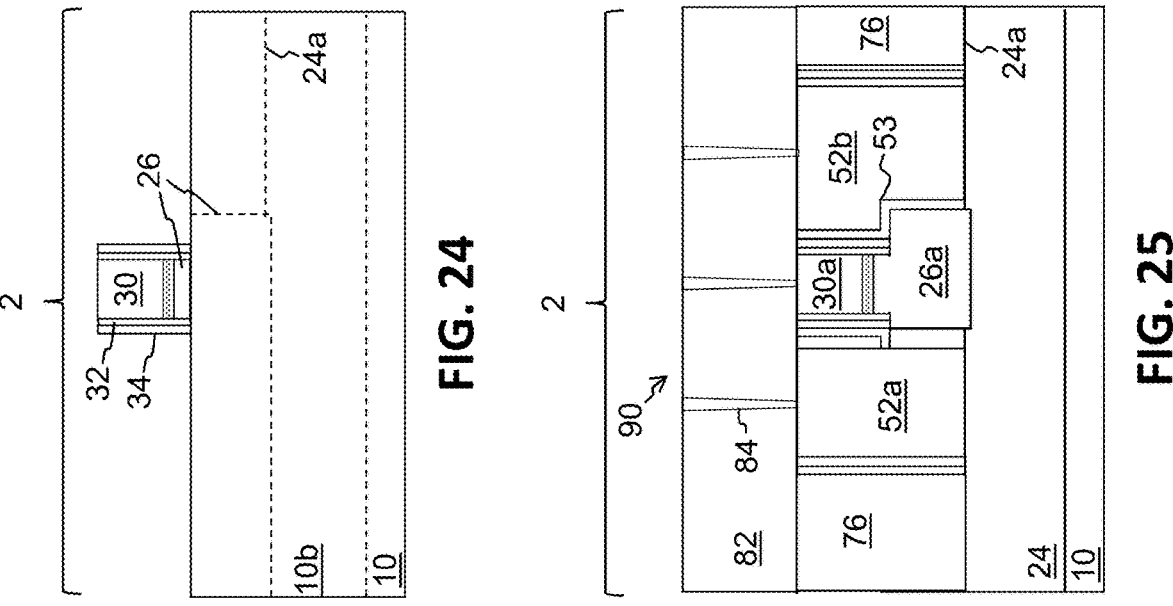
FIG. 24
FIG. 25
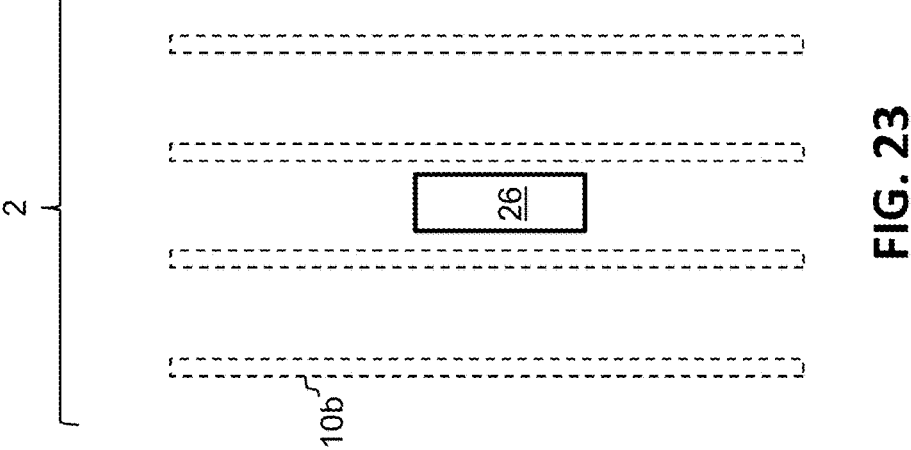
FIG. 23

SPLIT GATE NON-VOLATILE MEMORY CELLS, HV AND LOGIC DEVICES WITH FINFET STRUCTURES, AND METHOD OF MAKING SAME

PRIORITY CLAIM

This patent application is a divisional application of Ser. No. 17/152,441, filed Jan. 19, 2021, which claims priority to Chinese Patent Application No. 202011193113.X, filed on Oct. 30, 2020, entitled "Split Gate Non-volatile Memory Cells, HV And Logic Devices With FINFET Structures, And Method Of Making Same."

FIELD OF INVENTION

The present invention relates to non-volatile flash memory cell arrays, high voltage devices, and logic devices, all formed on the same semiconductor substrate.

BACKGROUND OF THE INVENTION

Split gate non-volatile memory devices are well known in the art. For example, U.S. Pat. No. 7,927,994, which is incorporated herein by reference, discloses a split gate non-volatile memory cell. FIG. 1 illustrates an example of such a split gate memory cell formed on a semiconductor substrate 110. Source and drain regions 112 and 113 are formed as diffusion regions in substrate 110, and define a channel region 114 of the substrate 110 there between. The memory cell includes four conductive gates: a floating gate 115 disposed over and insulated from a first portion of the channel region 114 and a portion of the source region 112, a control gate (also called a coupling gate) 116 disposed over and insulated from the floating gate 115, an erase gate 117 disposed over and insulated from the source region 112, and a select gate (also called a word line gate) 118 disposed over and insulated from a second portion of the channel region 114. A conductive contact 119 can be formed to electrically connect to the drain region 113. Because the channel region 114 is formed along the planar surface of the semiconductor substrate, as device geometries get smaller, so too does total area (e.g. width) of the channel region. This reduces the current flow between the source and drain regions, requiring, among other things, more sensitive sense amplifiers to detect the state of the memory cell.

Because the problem of shrinking the lithography size thereby reducing the channel width affects all semiconductor devices, a Fin-FET type of structure has been proposed. In a Fin-FET type of structure, a fin shaped member of semiconductor material connects the source to the drain regions. The fin shaped member has two side surfaces extending up and terminating in a top surface. Current from the source region to the drain region can then flow along the two side surfaces and the top surface. Thus, the width of the channel region is increased, thereby increasing the current flow. However, the width of the channel region is increased without sacrificing more semiconductor real estate by "folding" the channel region into two side surfaces and the top surface, thereby reducing the "footprint" of the channel region. Non-volatile memory cells using such Fin-FETs have been disclosed, where the floating gate and the select gate wrap around the top surface and two side surfaces of the fin shaped member. Some examples of prior art Fin-FET non-volatile memory structures (although the number and configuration of the gates varies from the above described planar example in FIG. 1) include U.S. Pat. Nos. 7,423,310, 7,410,913, 8,461,640, 9,985,042, and 10,468,428. It has also been proposed to form logic devices on fin shaped members. See for example U.S. Pat. Nos. 9,972,630 and 10,312,247.

However, what is needed is an improved technique to form FinFET memory cells, FinFET logic devices and FinFET HV (high voltage) devices on the same substrate of a memory device.

BRIEF SUMMARY OF THE INVENTION

A memory device includes:

a semiconductor substrate having an upper surface with a plurality of fins, wherein each of the fins extends upwardly and includes first and second side surfaces that oppose each other and that terminate in a top surface;

a memory cell formed on first and second fins of the plurality of fins, comprising:

a first channel region extending along the top surface and first and second side surfaces of the first fin between a source region of the first fin and a first drain region of the first fin, a second channel region extending along the top surface and first and second side surfaces of the first fin between the first drain region of the first fin and a second drain region of the first fin, a third channel region extending along the top surface and first and second side surfaces of the second fin between a source region of the second fin and a first drain region of the second fin, a fourth channel region extending along the top surface and first and second side surfaces of the second fin between the first drain region of the second fin and a second drain region of the second fin, a floating gate disposed between the first and second fins and extending along a first portion of the first channel region and a first portion of the third channel region, a control gate that extends along and is insulated from the floating gate, an erase gate having a first portion laterally adjacent to the floating gate and a second portion that is disposed over the floating gate, and a word line gate that extends along the second channel region and the fourth channel region, wherein the word line gate extends along and is insulated from the first and second side surfaces and the top surface of the first and second fins;

a high voltage (HV) device formed on a third fin of the plurality of fins, comprising:

a HV channel region extending along the top surface and first and second side surfaces of the third fin between a HV source region of the third fin and a HV drain region of the third fin, and a HV gate that extends along the HV channel region, wherein the HV gate extends along and is insulated from the first and second side surfaces and the top surface of the third fin; and a logic device formed on a fourth fin of the plurality of fins, comprising:

a logic channel region extending along the top surface and first and second side surfaces of the fourth fin between a logic source region of the fourth fin and a logic drain region of the fourth fin, and a logic gate that extends along the logic channel region, wherein the logic gate extends along and is insulated from the first and second side surfaces and the top surface of the fourth fin.

A method of forming a memory device includes:

forming a plurality of fins in an upper surface of a semiconductor substrate, wherein each of the fins extends upwardly and includes first and second side surfaces that oppose each other and that terminate in a top surface; and forming a memory cell on first and second fins of the plurality of fins, a high voltage (HV) device on a third fin of the plurality of fins, and a logic device on a fourth fin of the plurality of fins, by:

forming a floating gate between the first and second fins;

forming a control gate over and insulated from the floating gate;

forming a layer of conductive material over the first fin, the second fin, the third fin and the fourth fin, wherein the layer of conductive material is polysilicon;

selectively removing portions of the layer of conductive material, leaving:

a word line gate as a first remaining portion of the layer of conductive material over the first and second fins, an erase gate as a second remaining portion of the layer of conductive material over the first and second fins, wherein the control gate is disposed between the word line gate and the erase gate, a HV gate as a third remaining portion of the layer of conductive material over the third fin, and a dummy gate as a fourth remaining portion of the layer of conductive material over the fourth fin;

forming a source region in the first fin adjacent the erase gate;

forming a first drain region in the first fin adjacent the word line gate;

forming a second drain region in the first fin between the word line gate and the control gate, wherein a first channel region of the first fin extends along the top surface and the first and second side surfaces of the first fin between the source region of the first fin and the second drain region of the first fin, and wherein a second channel region of the first fin extends along the top surface and the first and second side surfaces of the first fin between the first drain region of the first fin and the second drain region of the first fin, wherein the floating gate is disposed adjacent to the second side surface of the first fin for controlling a conductivity of a portion of the first channel region extending along the second side surface of the first fin, and wherein the floating gate is not disposed adjacent to the first side surface of the first fin;

forming a source region in the second fin adjacent the erase gate;

forming a first drain region in the second fin adjacent the word line gate;

forming a second drain region in the second fin between the word line gate and the control gate, wherein a first channel region of the second fin extends along the top surface and the first and second side surfaces of the second fin between the source region of the second fin and the second drain region of the second fin, and wherein a second channel region of the second fin extends along the top surface and the first and second side surfaces of the second fin between the first drain region of the second fin and the second drain region of the second fin, wherein the floating gate is disposed adjacent to the first side surface of the second fin for controlling a conductivity of a portion of the first channel region extending along the first side surface of the second fin, and wherein the floating gate is not disposed adjacent to the second side surface of the second fin;

forming source and drain regions in the third fin adjacent the HV gate, wherein a channel region of the third fin extends along the top surface and the first and second side surfaces of the third fin between the source and drain regions of the third fin;

forming source and drain regions in the fourth fin adjacent the dummy gate, wherein a channel region of the fourth fin extends along the top surface and the first and second side surfaces of the fourth fin between the source and drain regions of the fourth fin; and replacing the dummy gate with a logic gate formed of metal while maintaining the HV gate as the third remaining portion of the layer of conductive material.

Other objects and features of the present invention will become apparent by a review of the specification, claims and appended figures.

BRIEF DESCRIPTION OF THE DRAWINGS

FIGS. 9A-20A are side cross sectional views (along the fins in the column direction) showing the steps in forming the split-gate non-volatile memory cell of the present invention.

FIGS. 9B-20B are side cross sectional views (along the fins in the column direction) showing the steps in forming the HV device of the present invention.

FIGS. 9C-20C are side cross sectional views (along the fins in the column direction) showing the steps in forming the logic device of the present invention.

FIG. 23 is a plan view of the memory cell area in a first alternate embodiment of the present invention.

FIGS. 24-25 are side cross sectional views of the memory cell area in a second alternate embodiment of the present invention.

DETAILED DESCRIPTION OF THE INVENTION

The present invention is directed to a memory device containing non-volatile memory cells, high voltage (HV) devices (e.g., devices designed to operate at higher voltages than logic devices) and logic devices on the same semiconductor substrate 10, and to the formation of such a memory device.

Figure 1:
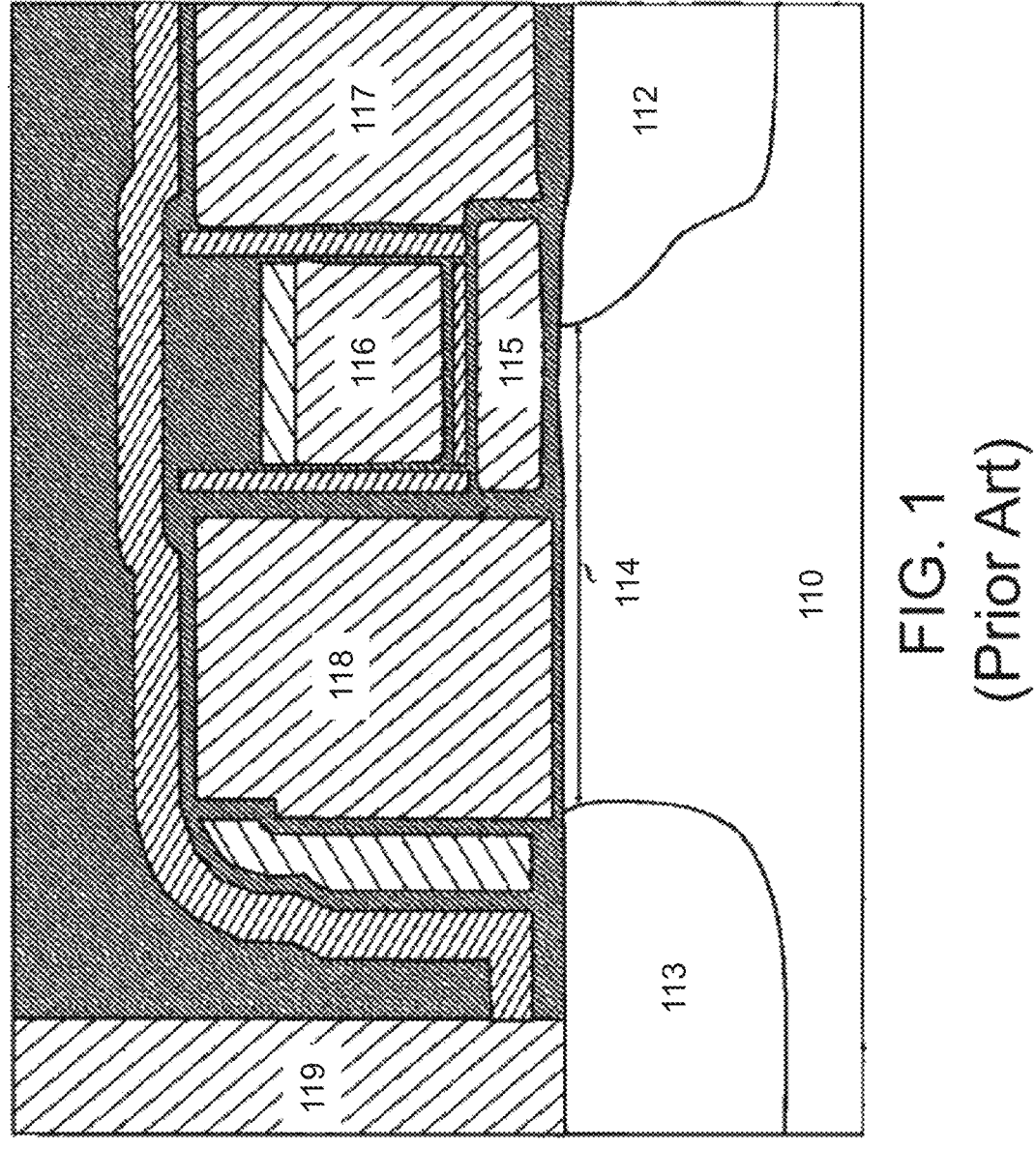
FIG. 1 is a side cross sectional view of a conventional non-volatile memory cell.
Figure 2A:
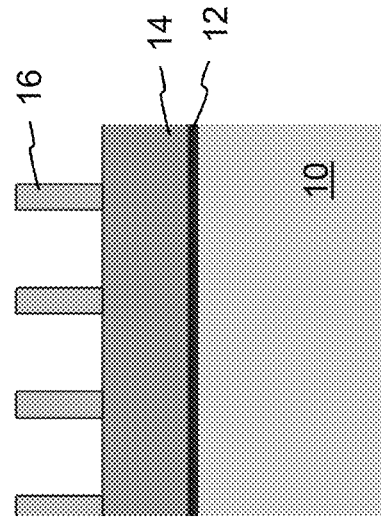
FIGS. 2A-2E are side cross sectional views (along the row direction) showing the steps in forming fins on the upper surface of the semiconductor substrate.

The process of forming the memory device begins by forming fins in the upper surface 10a of the substrate 10. Fin formation begins by forming a silicon dioxide (oxide) layer 12 on the top surface 10a of a silicon semiconductor substrate 10. A silicon nitride (nitride) layer 14 is formed on oxide layer 12. A hard mask material 16 is formed on the nitride layer 14. Photoresist 18 is formed on the hard mask material 16. The photoresist 18 is then patterned, which includes a photolithography process that selectively exposes portions of the photoresist 18, and selectively removes portions of the photoresist 18 to expose selective portions of the underlying material (i.e., strips of the hard mask material 16 in this case). The resulting structure is shown in FIG. 2A.

Figure 2B:
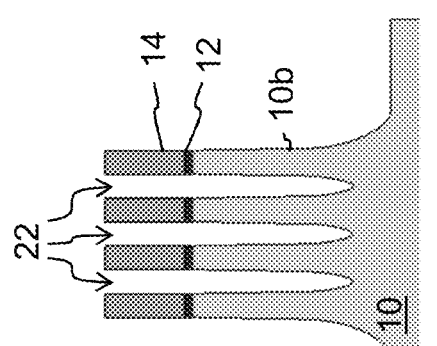
Figure 2C:
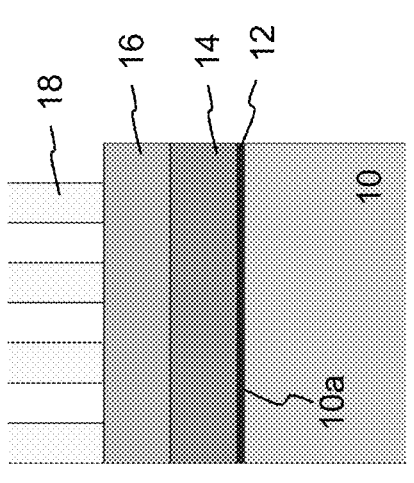

An etch is performed to remove the exposed portions of hard mask material 16, leaving vertical strips of hard mask material 16 as shown in FIG. 2B (after removal of photoresist 18). Nitride spacers 20 are formed along the sides of the hard mask material strips 16. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). Nitride spacers 20 are formed by deposition of nitride, followed by anisotropic nitride etch, which leaves nitride spacers 20 on vertical sidewalls of hard mask strips 16. An etch is performed to remove hard mask strips 16, as shown in FIG. 2C.

Figure 2D:
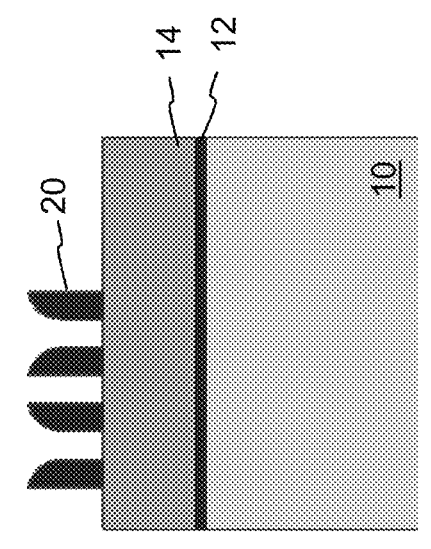
Figure 2E:
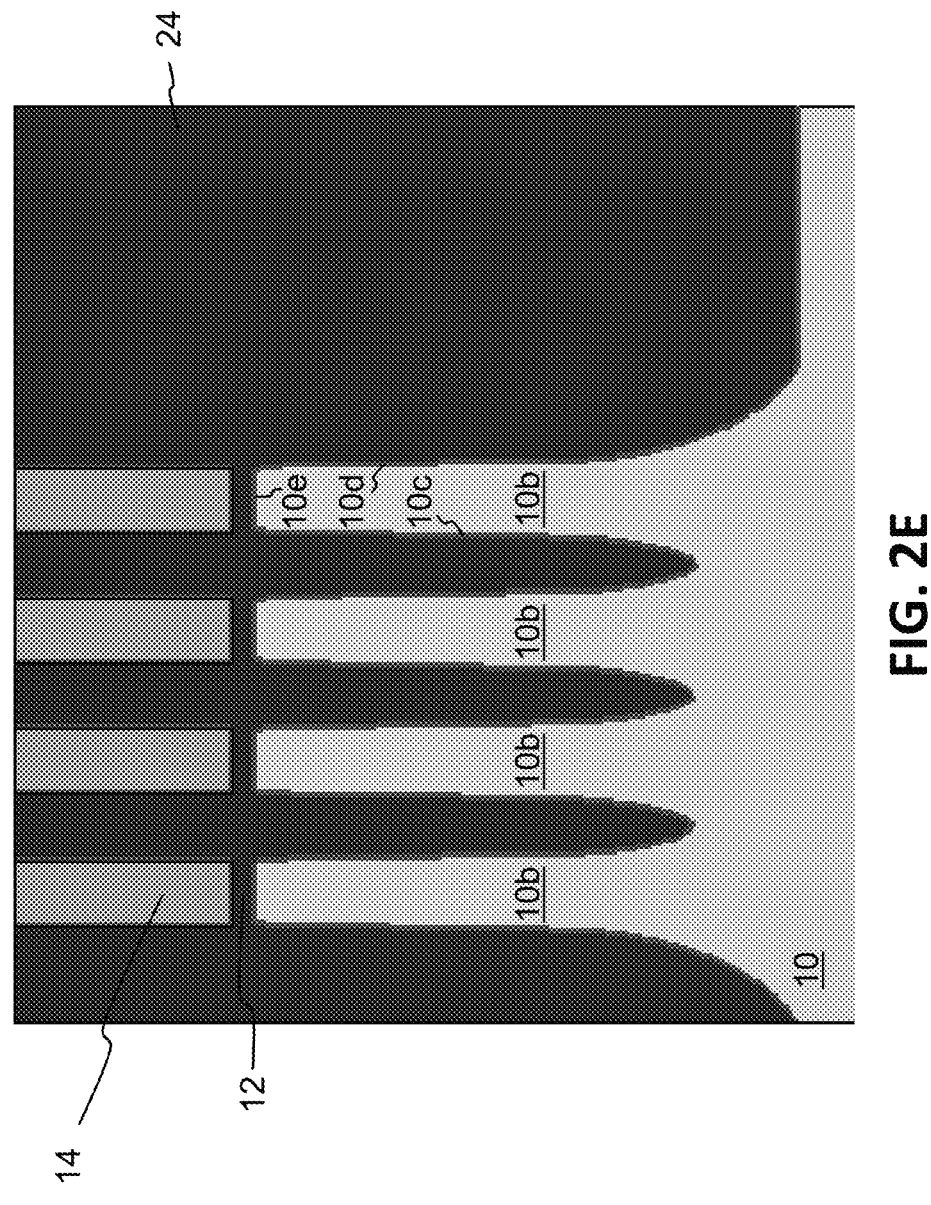

One or more etches are performed to remove those portions of nitride layer 14, oxide layer 12 and upper portions of substrate 10 that are not underneath nitride spacers 20, which results in the formation of trenches 22 that extend into the substrate 10, leaving thin fin structures 10b (referred to herein as "fins" 10b) of the substrate 10 between adjacent trenches 22, as illustrated in FIG. 2D. These etches also remove nitride spacers 20. Insulation material 24 (e.g., oxide) is formed over the structure (including filling trenches 22 with oxide 24), followed by oxide planarization such as chemical mechanical polish (CMP) to remove any portion of oxide 24 above the tops of nitride layer 14, as shown in FIG. 2E. Each fin 10b is upwardly extending and has two opposing side surfaces 10c and 10d that extend up and terminate in a top surface 10e.

Figures 3A, 3B, 3C:
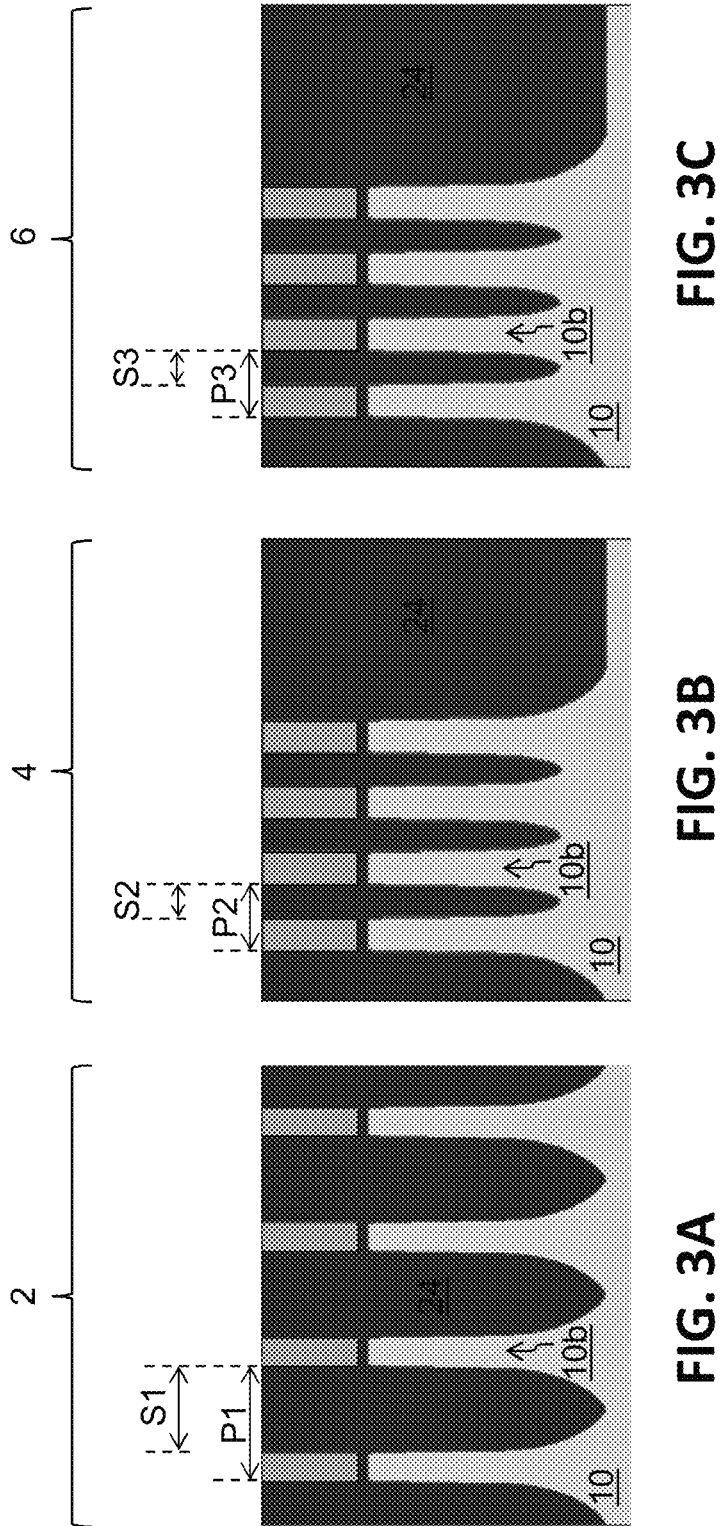
FIGS. 3A-3C are side cross sectional views showing the fins formed in the memory cell area, the HV device area, and the logic device area of the substrate.
Figures 4A, 4B, 4C:
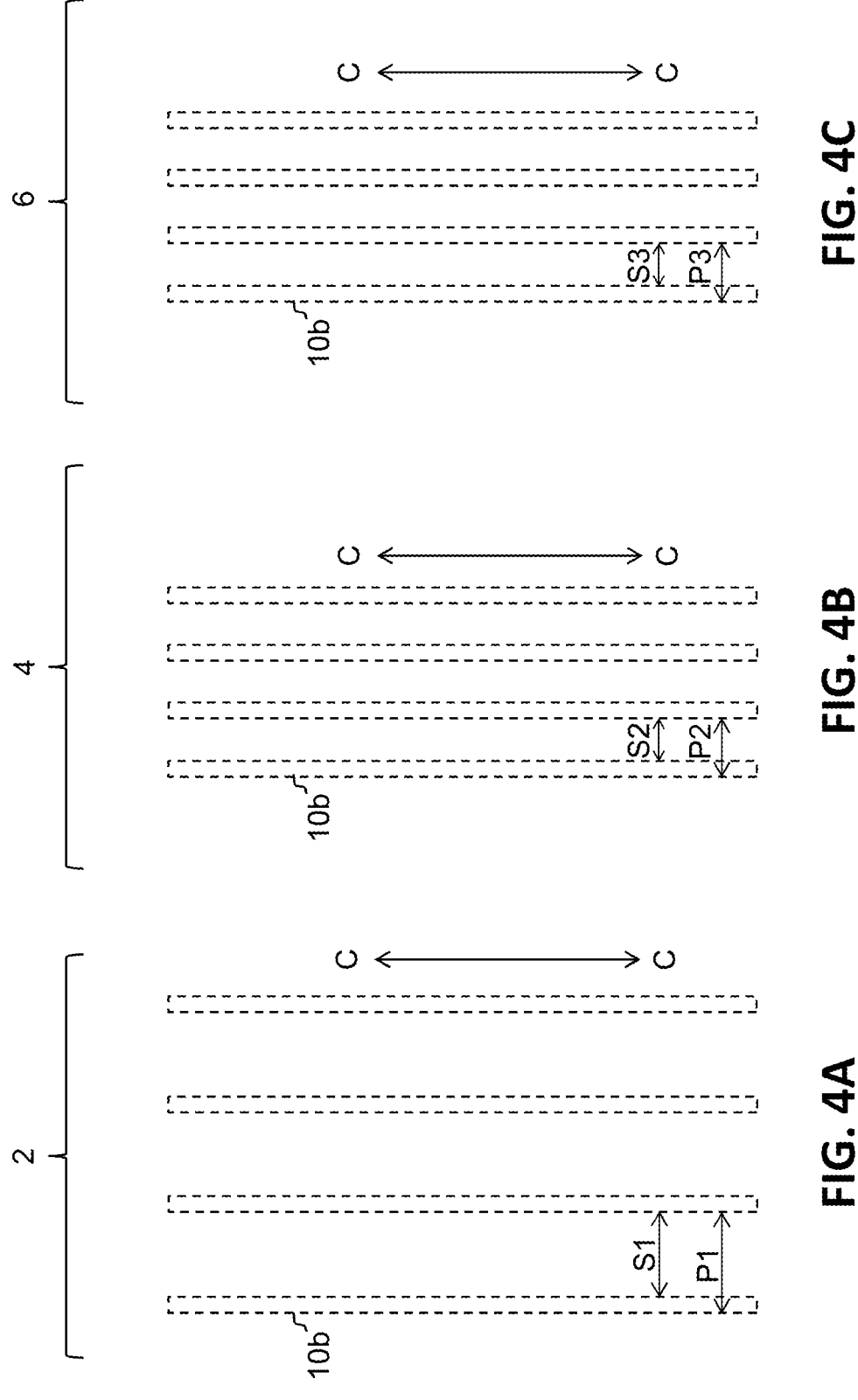
FIGS. 4A-4C are plan views showing the fins formed in the memory cell area, the HV device area, and the logic device area of the substrate.
Figures 5A, 5B, 5C:
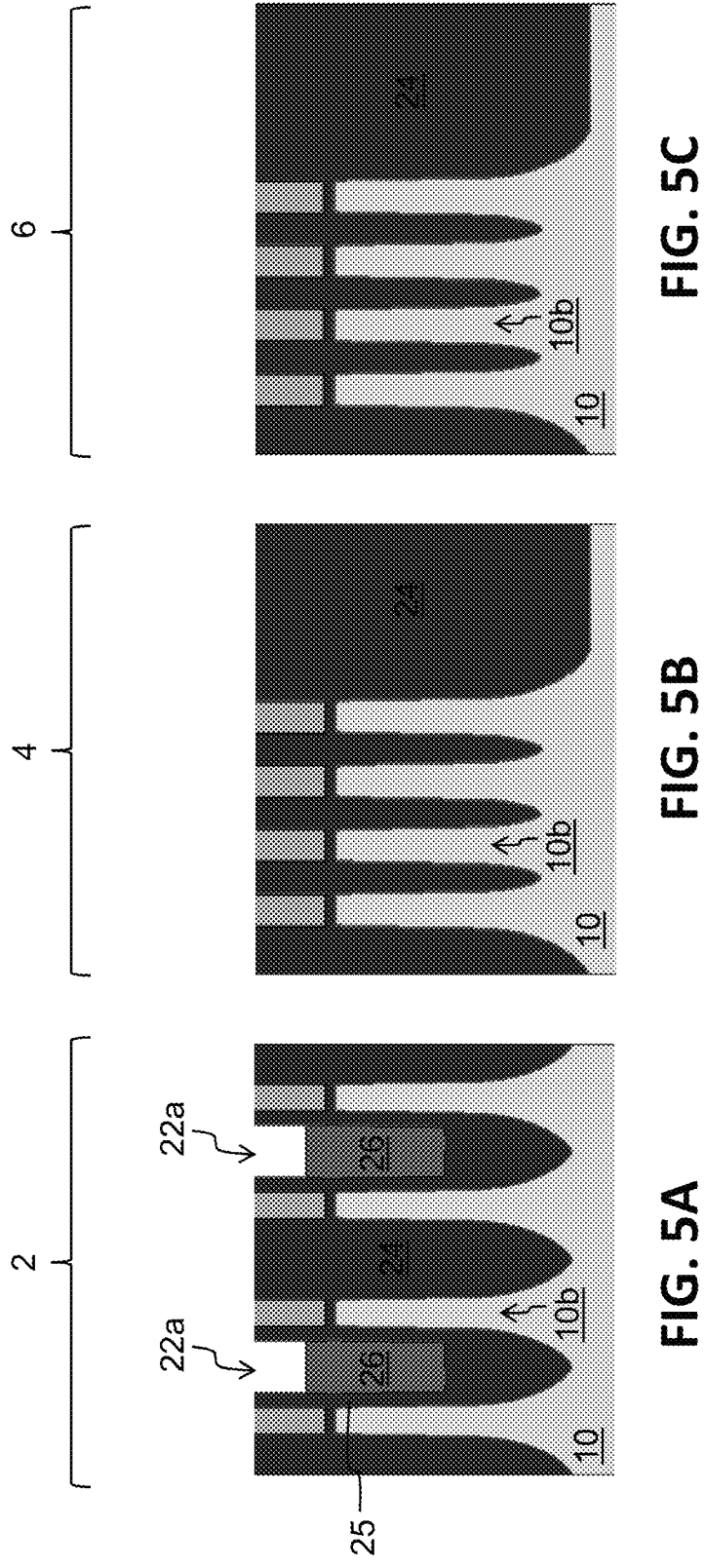
FIGS. 5A, 7A and 8A are side cross sectional views (along the row direction) showing the steps in forming the split-gate non-volatile memory cell of the present invention.
FIGS. 5B, 7B and 8B are side cross sectional views (along the row direction) showing the steps in forming the HV device of the present invention.
FIGS. 5C, 7C and 8C are side cross sectional views (along the row direction) showing the steps in forming the logic device of the present invention.
Figures 6A, 6B, 6C:
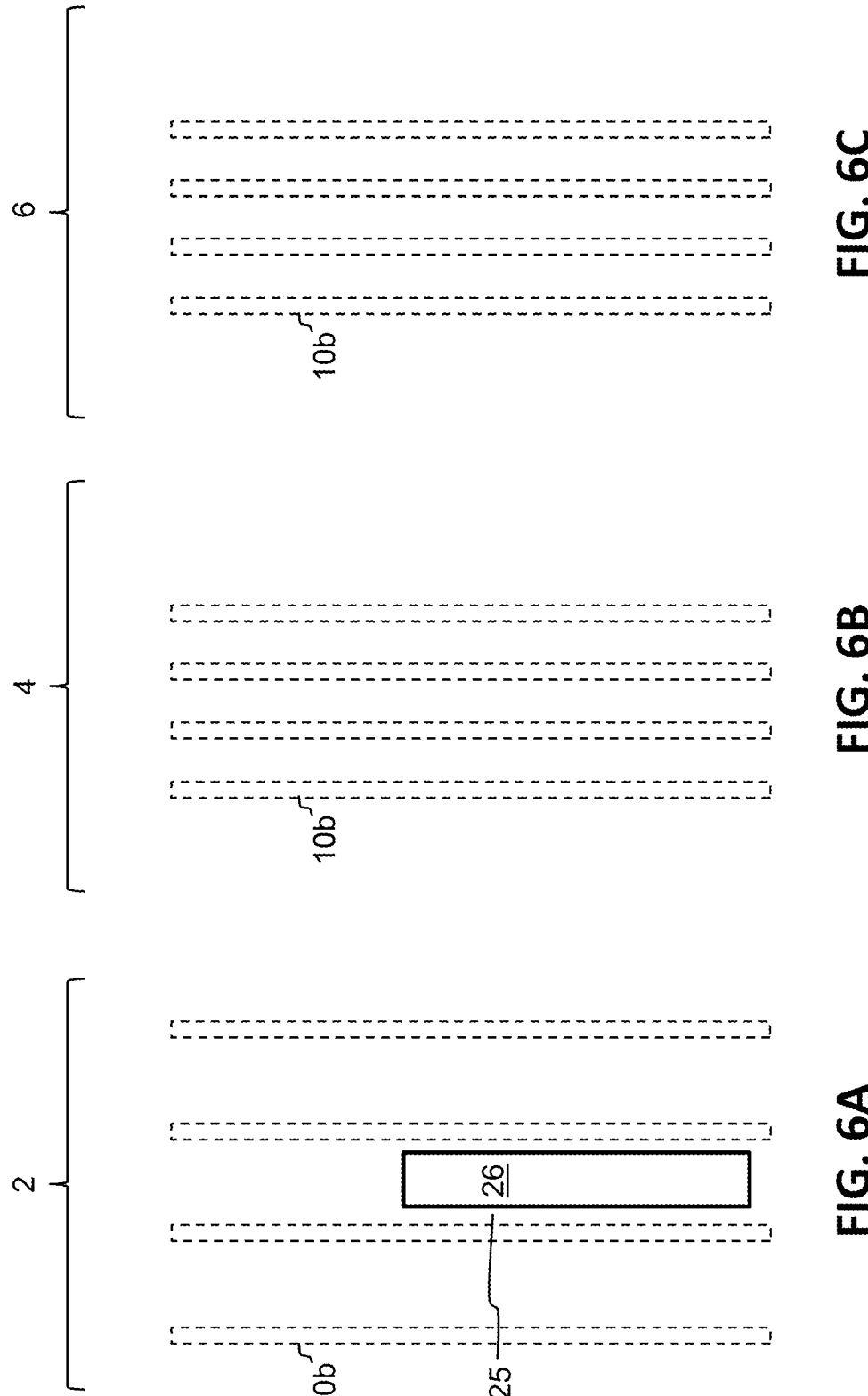
FIG. 6A is a plan view showing the steps in forming the split-gate non-volatile memory cell of the present invention.
FIG. 6B is a plan view showing the fins in the HV device of the present invention.
FIG. 6C is a plan view showing the fins in forming the logic device of the present invention.

The fins 10a are formed simultaneously in all three areas of the substrate 10 (memory cell area 2, HV device area 4, logic device area 6). However, the pitch between like surfaces (e.g., distance between side surfaces 10c) of adjacent fins 10b, and/or the spacing S between adjacent fins 10b, vary between the three area. Specifically, the pitch P1 and spacing S1 in memory cell area 2 are greater than pitch P2 and spacing S2 respectively in the HV device area 4 and greater than the pitch P3 and spacing S3 respectively in the logic device area 6, as shown in FIGS. 3A-3C. The depth of trenches 22 can be the same in memory cell area 2, HV device area 4, and logic device area 6, in which case the fins 10b all have the same height. Alternately, the trenches 22 in the memory cell area 2 can be deeper than those in the HV device area 4 and logic device area 6, so the fins 10b are taller in the memory cell area 2. The pitch P1 and spacing S1 are made greater in the memory cell area 2 by patterning the photoresist 18 so that strips 16 shown in FIG. 2B are wider and spaced further apart in the memory cell area 2 than the strips 16 in the HV device area 4 and logic device area 6. Thicker spacers 20 will also increase the thickness of fins 10a, and also result in a greater pitch P1, P2, P3. Pitches P2 and P3 can be, but need not be, equal to each other. Similarly, spacings S2 and S3 can be, but need not be, equal to each other. Preferably, fins 10b extend in the column direction C-C and are parallel to each other in the memory cell area 2, HV device area 4 and the logic device area 6, as illustrated in the plan views in FIGS. 4A-4C.

Photoresist is formed on the structure, and patterned to expose portions of oxide 24 between alternating fins 10b in the memory cell area 2 (i.e., oxide 24 on only one side of any given fin is left exposed), while leaving HV device area 4 and logic device area 6 covered with photoresist. An oxide etch recesses exposed portions of oxide 24 in the memory cell area 2 (exposing side surfaces 10c/10d of the affected fins 10b), creating holes 22a in the oxide 24 between alternating fins 10b (i.e. holes 22a are formed on only one side of any given fin). After photoresist removal, a layer of insulation 25 (e.g. oxide) is formed on the exposed side surfaces 10c/10d of fins 10b (e.g., by oxide deposition or thermal oxidation). The holes 22a are filled with conductive material by material deposition, a chemical mechanical polish (CMP) using nitride layer 14 as a stop layer, and an etch back to recess the conductive material below the tops of nitride 14, leaving first blocks of conductive material 26 between adjacent fins 10b in the memory cell area 2, as shown in FIGS. 5A-5C and 6A-6C. First blocks of conductive material 26 can be doped polysilicon or doped amorphous silicon.

Figures 7A, 7B, 7C:
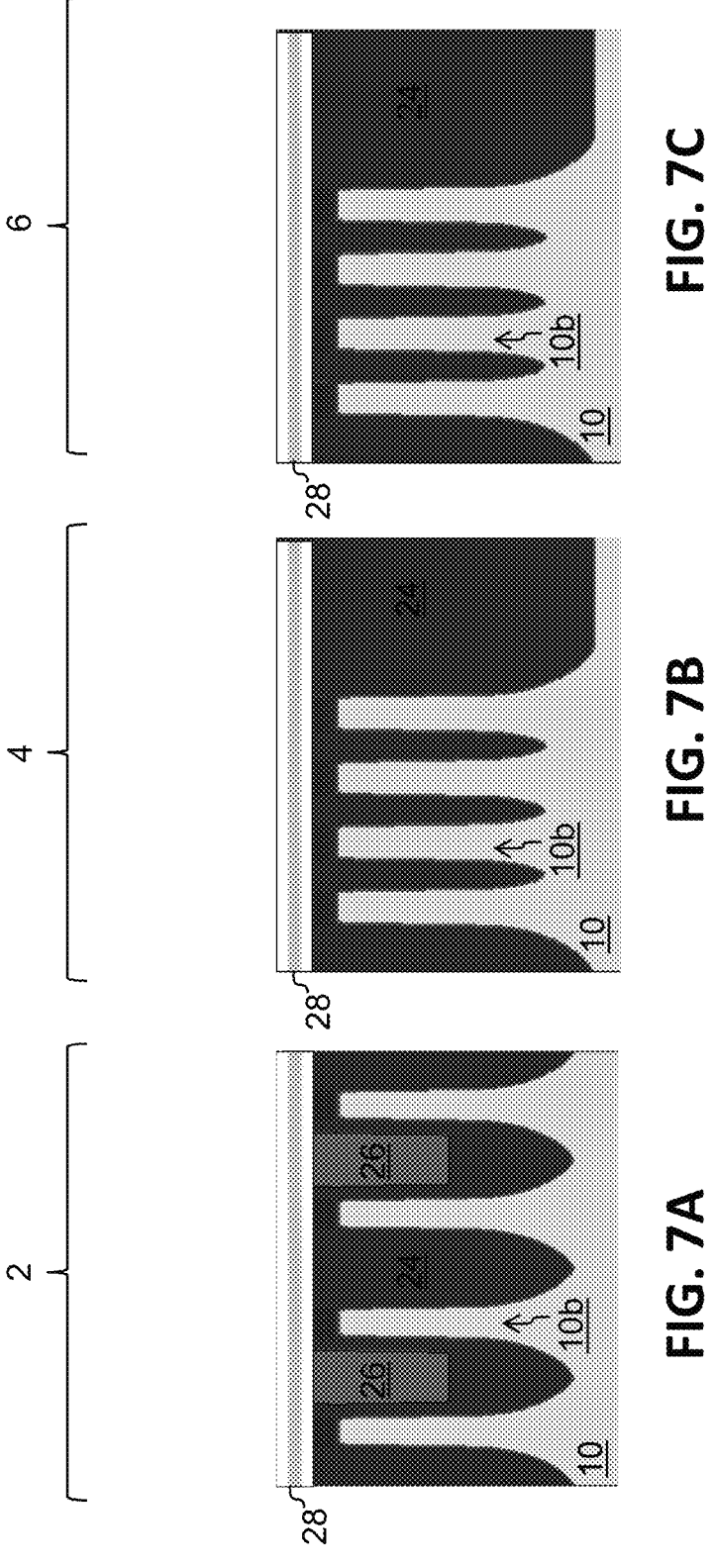

An etch is used to remove nitride layer 14. Oxide is deposited on the structure to fill the voids in the oxide 24 left by removing the nitride layer 14 and to cover the first blocks of conductive material 26. A CMP is performed, using the first blocks of conductive material 26 as a stop. This leaves the tops of the fins 10b covered with oxide 24. An insulation layer 28 is formed on the structure, as shown in FIGS. 7A-7C. Preferably, insulation layer 28 is an ONO layer, meaning it has oxide-nitride-oxide sublayers.

Figures 8A, 8B, 8C:
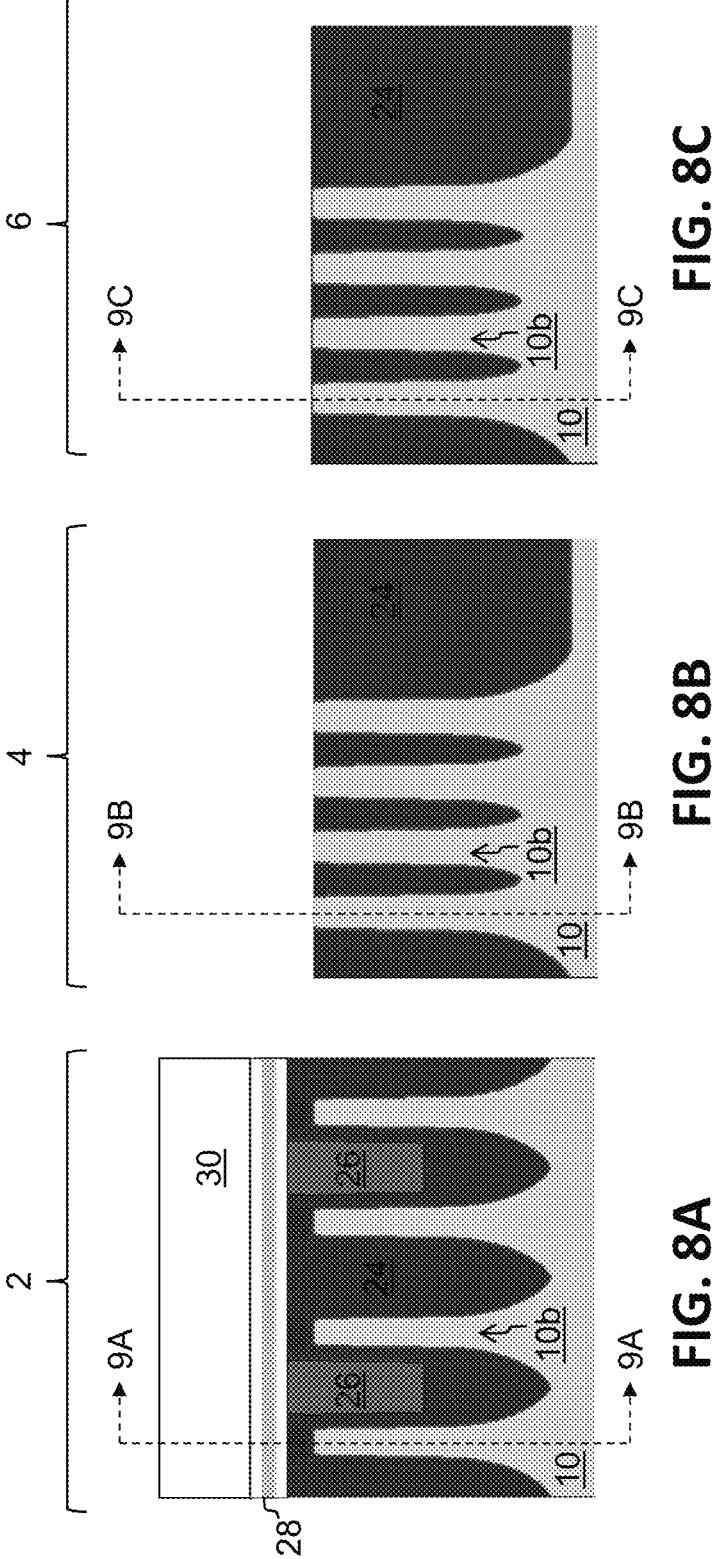
Figures 9A, 9B, 9C:
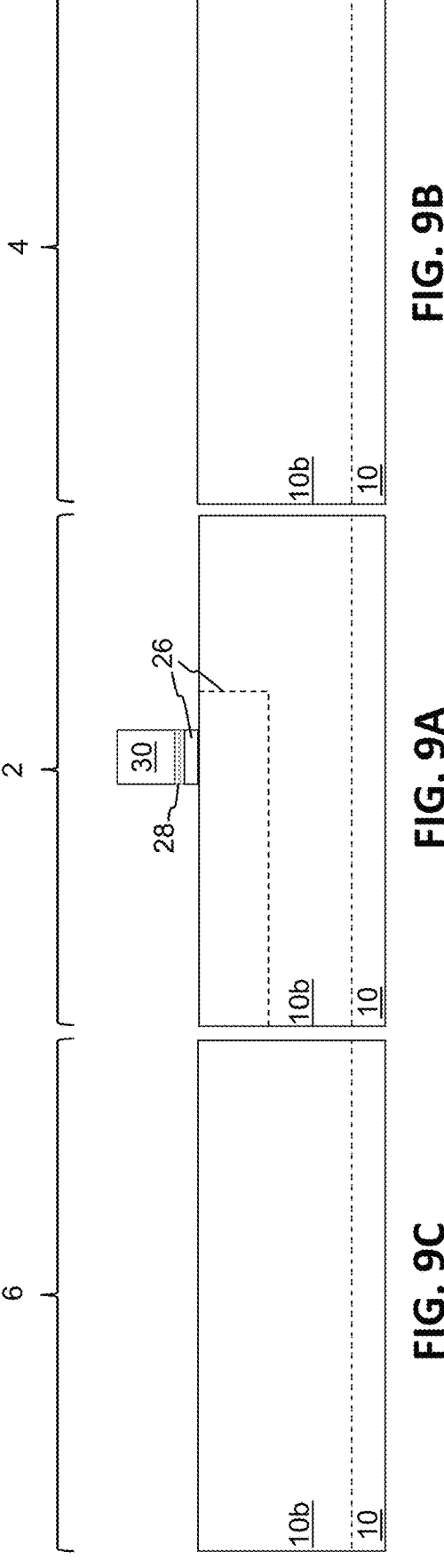

A layer of conductive material 30 (conductive layer 30) is formed over the structure, i.e. over insulation layer 28. Preferably, the layer of conductive material 30 is doped polysilicon or doped amorphous silicon. Photoresist is formed on the layer of conductive material 30 and patterned to leave strips of photoresist extending in the horizontal/row direction. One or more etches are performed to remove the layer of conductive material 30 and the insulation layer 28 from the structure, except for strips of conductive layer 30 (and remaining portions of insulation layer 28 underneath), in the memory cell area 2, as shown in FIGS. 8A-8C (views taken along the row direction) and 9A-9C (views taken along the column direction). The strips of conductive material 30 extend in the row direction (orthogonal to the column direction). Preferably, the portions of the first blocks of conductive material 26 under strips of conductive material 30 extend up slightly above the tops of fins 10*b*.

Figures 10A, 10B, 10C:
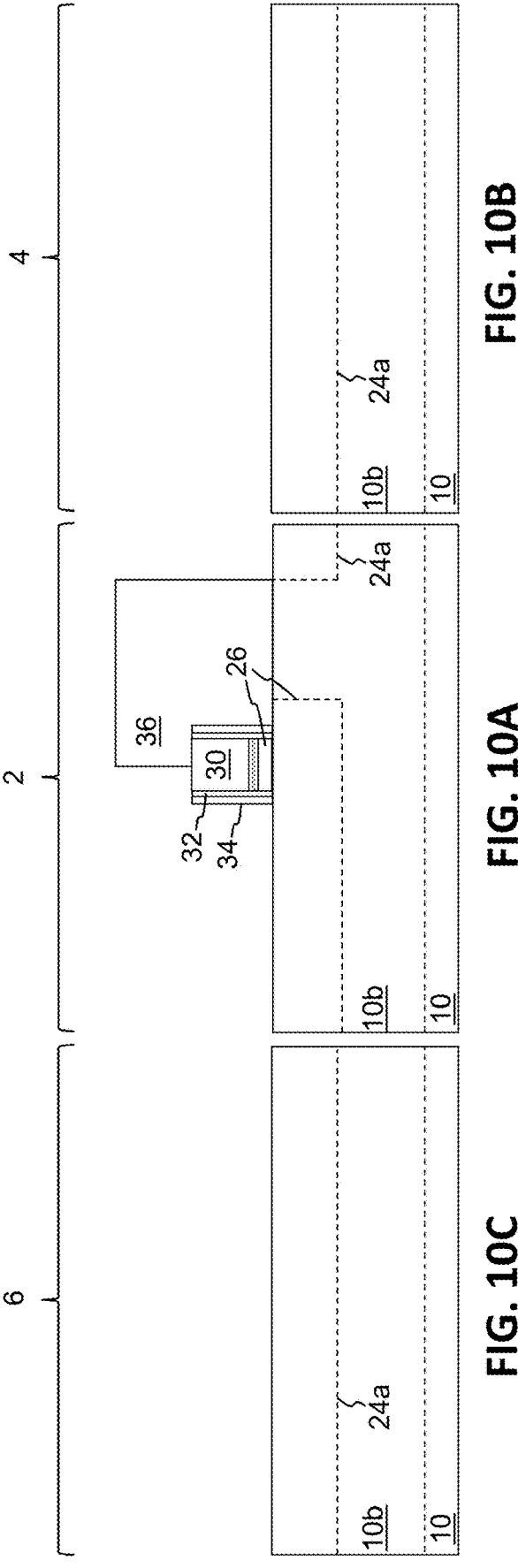

Insulation spacers 32/34 (e.g., ON—oxide and nitride, respectively) are formed along the sidewalls of strips of conductive material 30. Insulation (ON) spacers 32/34 are formed by oxide deposition, nitride deposition, and then nitride anisotropic etch and oxide anisotropic etch. At this stage, implantations into the HV device area 4 and logic device area 6 can be separately performed (i.e., implanting into just one area by covering the other areas with photoresist). Photoresist is then formed over the structure, and removed from the HV device area 4 and logic device area 6 entirely, and from portions of the memory cell area 2, leaving a strip of photoresist 36 covering the spacers 32/34 on a first side of the strip of conductive material 30, as well as the adjacent portion of the fin 10*b*, the first block of conductive material 26 and oxide 24. An etch is then performed to recess top surface 24*a* of the oxide 24 between the fins 10*b* in the HV device area 4 and logic device area 6, and between the fins 10*b* in the memory cell area 2 except for those portions of oxide 24 underneath the strip of photoresist 36 and underneath first blocks of conductive material 26, as shown in FIGS. 10A-10C.

Figures 11A, 11B, 11C:
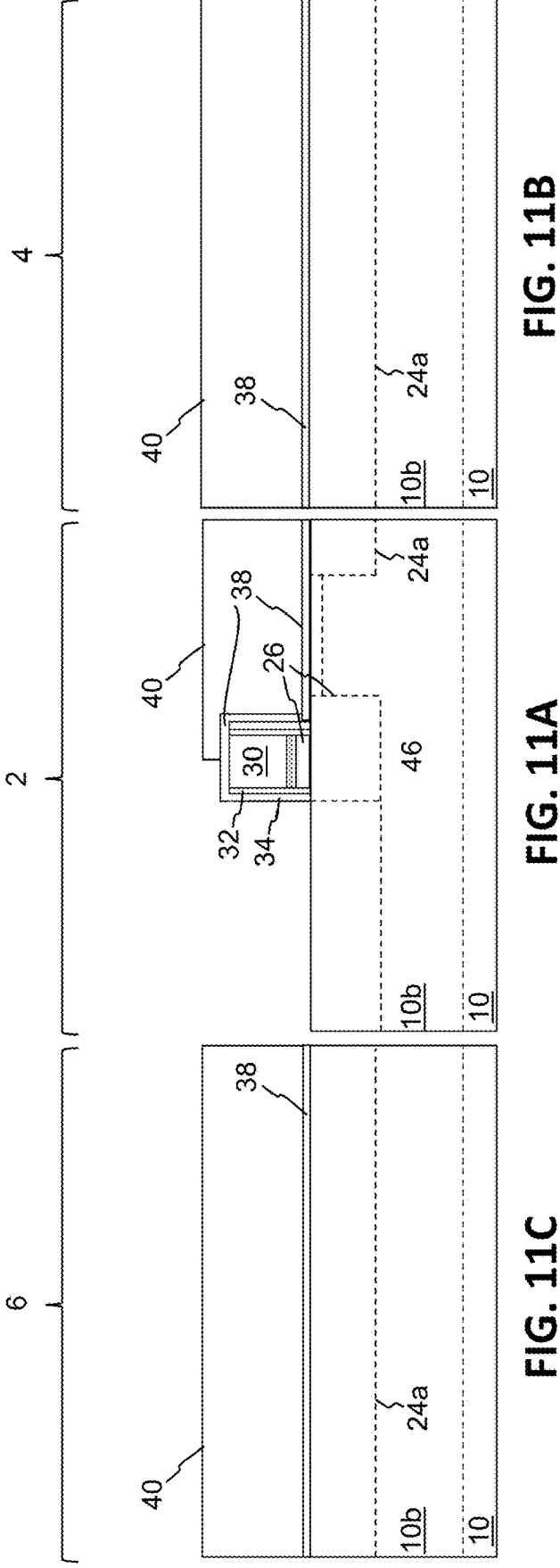

After the strip of photoresist 36 is removed, an insulation layer 38 is formed on the structure (e.g., an oxide layer formed by HTO deposition and anneal). Photoresist 40 is then formed over the structure and partially removed, leaving the HV device area 4 and logic device area 6 covered entirely, and leaving a strip of photoresist 40 covering the spacers 32/34 on the first side of the strip of conductive material 30, as well as the adjacent portion of the fin 10*b* and the first block of conductive material 26 and oxide 24. An etch is then performed to remove the exposed portion of first block of conductive material 26 adjacent to the second side of the strip of conductive material 30 (opposite the first side), and exposed portions of insulation layer 38, as shown in FIGS. 11A-11C.

Figures 12A, 12B, 12C:
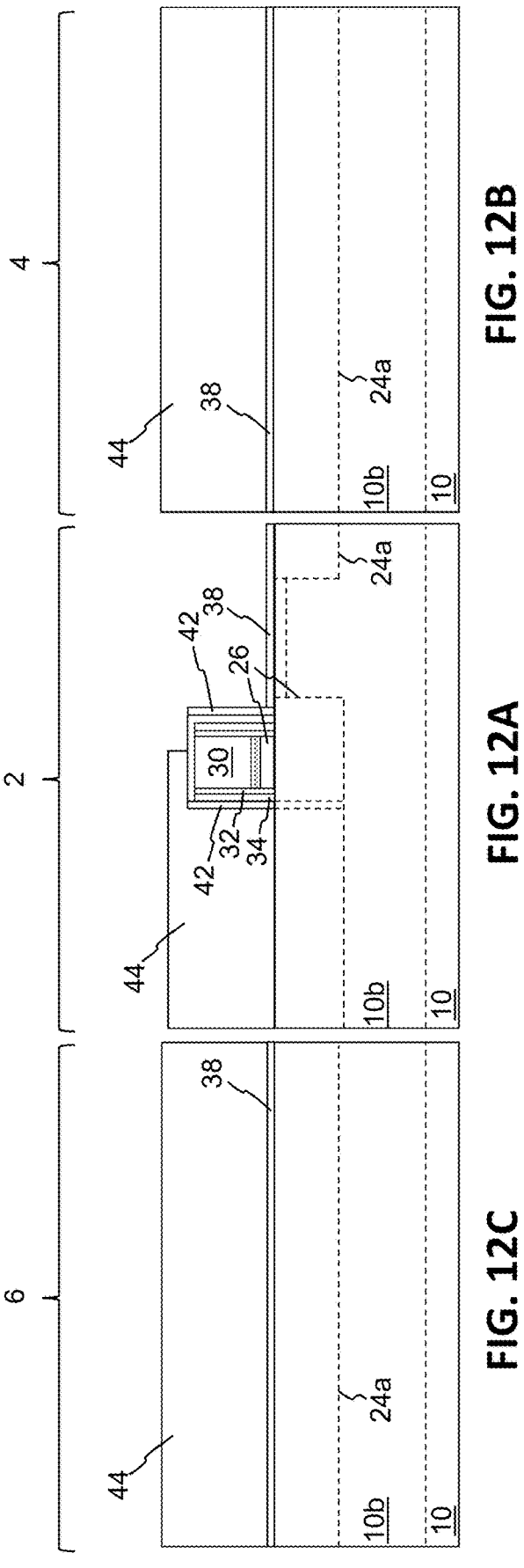

After photoresist 40 is removed, insulation spacers 42 (e.g., oxide spacers made by oxide deposition such as HTO deposition, anneal, and anisotropic etch) are formed along the spacers 34 adjacent the sidewalls of strips of conductive material 30. Photoresist 44 is then formed on the structure and selectively removed, leaving HV device area 4 and logic device area 6 covered entirely, and leaving a strip of photoresist 44 covering the spacers 32/34 on the second side of the strip of conductive material 30, as well as the adjacent portion of the fin 10*b* and oxide 24, as shown in FIGS. 12A-12C.

Figures 13A, 13B, 13C:
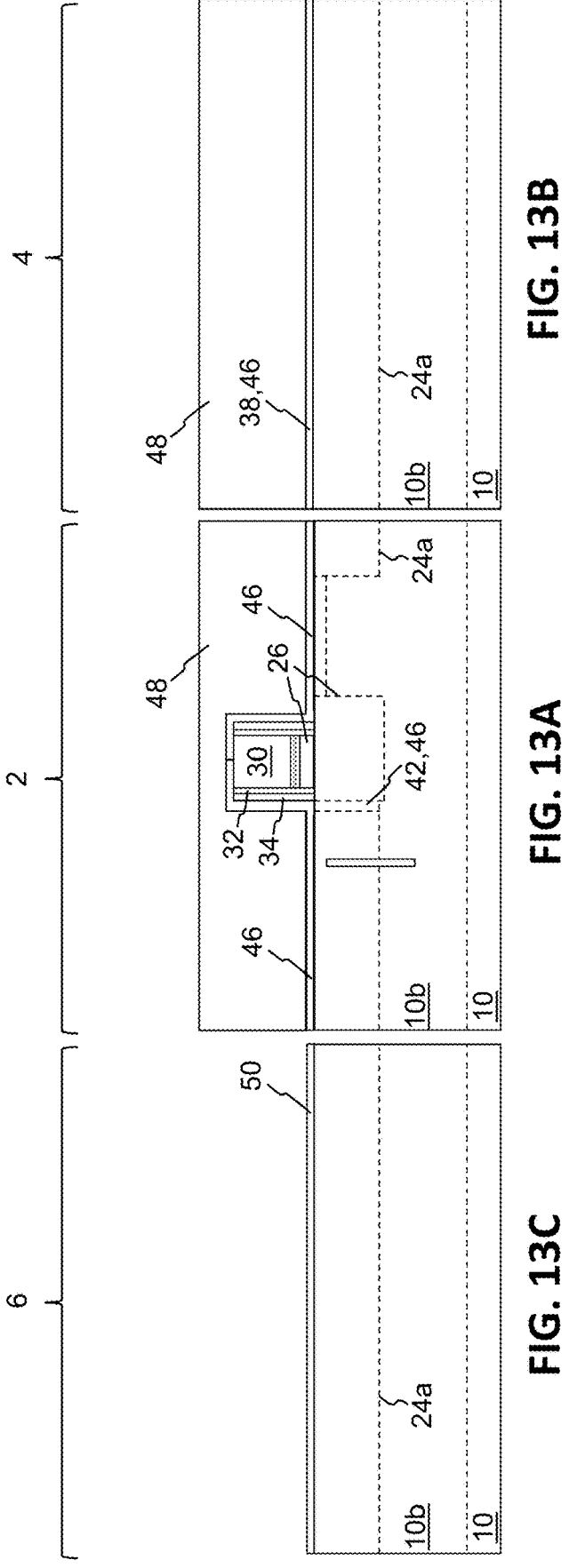
Figures 14A, 14B, 14C:
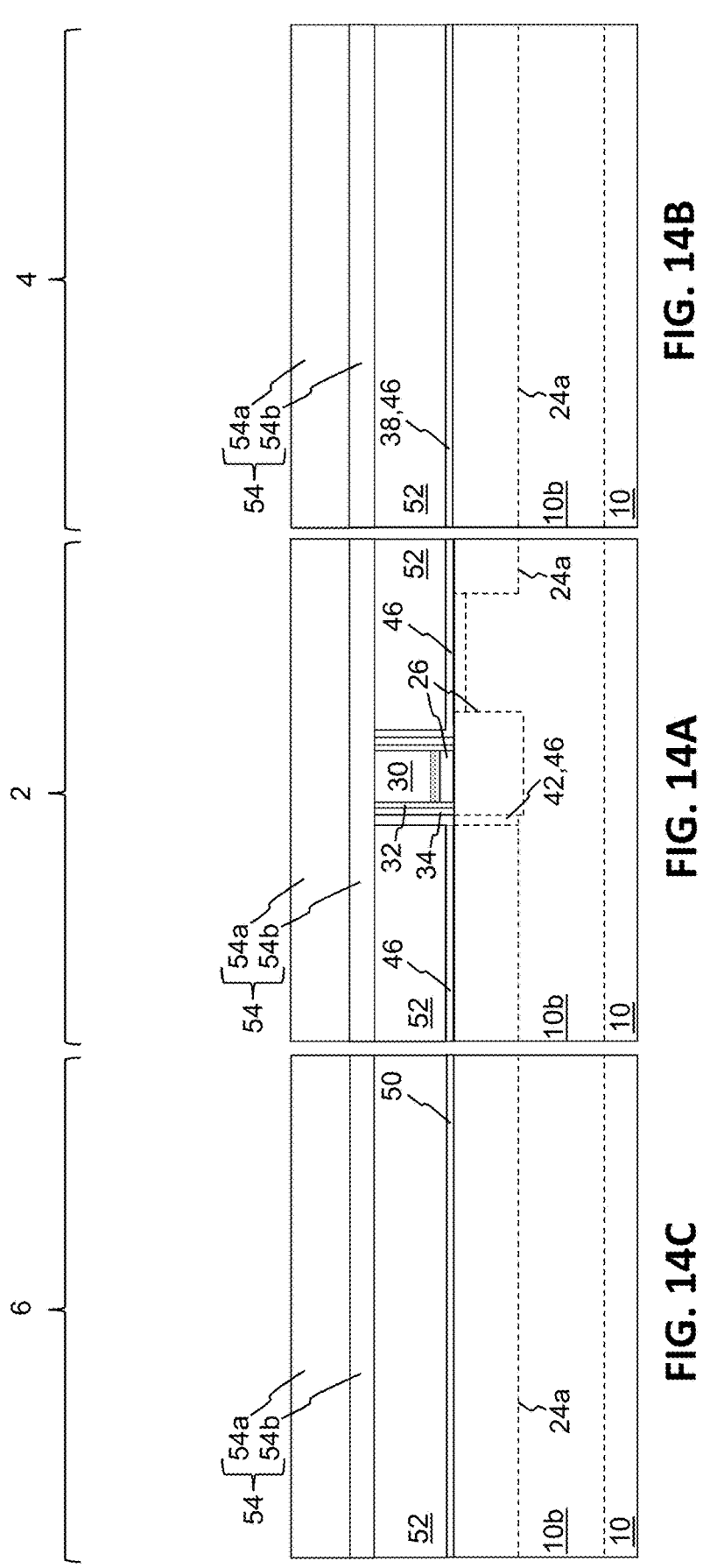
Figures 15A, 15B, 15C:
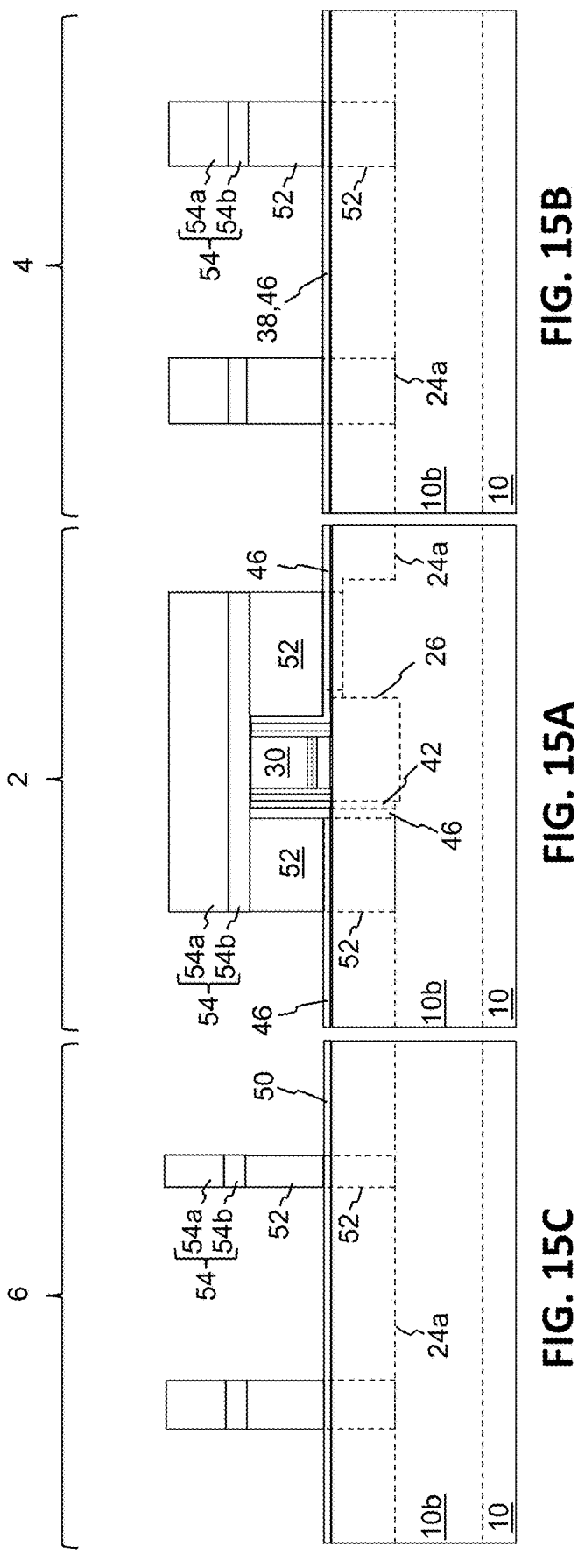

An etch is then performed to remove the exposed portions of insulation layer 38 and insulation spacers 42. After photoresist 44 is removed, an insulation layer 46 is formed (e.g., a tunnel oxide formed by HTO deposition and anneal). Photoresist 48 is then formed on the structure, and partially removed, so that it covers the HV device area 4 and memory cell area 2 entirely, but leaves the logic device area 6 exposed. An etch is used to remove insulation layer 38 and insulation layer 46, leaving the upper portions of fins 10*b* exposed. An insulation layer 50 is then formed on the exposed portions of the fins 10*b* in the logic device area 6, with the resulting structure shown in FIGS. 13A-13C. Insulation layer 50 can be oxide, oxynitride, and/or other dielectric material. Removing insulation layer 38 and insulation layer 46 and replacing them with insulation layer 50 allows for individual tuning of the components, as will be described further below, by selecting different thicknesses and/or composition After photoresist 48 is removed, a layer of conductive material 52 is formed over the structure. Preferably, the layer of conductive material 52 is polysilicon. An optional implantation step can be performed to implant dopant in the layer of conductive material 52. A chemical-mechanical polish (CMP) can be used to planarize the top surface of the layer of conductive material 52. An etch can optionally be used to further recess the top surface of the layer of conductive material 52. A hard mask layer 54 is formed over the layer of conductive material 52. Preferably, hard mask layer 54 includes a plurality of sublayers (e.g., oxide layer 54*a* and nitride layer 54*b*), as shown in FIGS. 14A-14C. The hard mask layer 54 is patterned using a photolithography step to remove portions of the hard mask layer 54 in the memory cell area 2, HV device area 4 and logic device area 6, leaving portions of the underlying layer of conductive material 52 exposed. An anisotropic etch is then used to remove the exposed portions of the layer of conductive material 52, as shown in FIGS. 15A-15C.

Figures 16A, 16B, 16C:
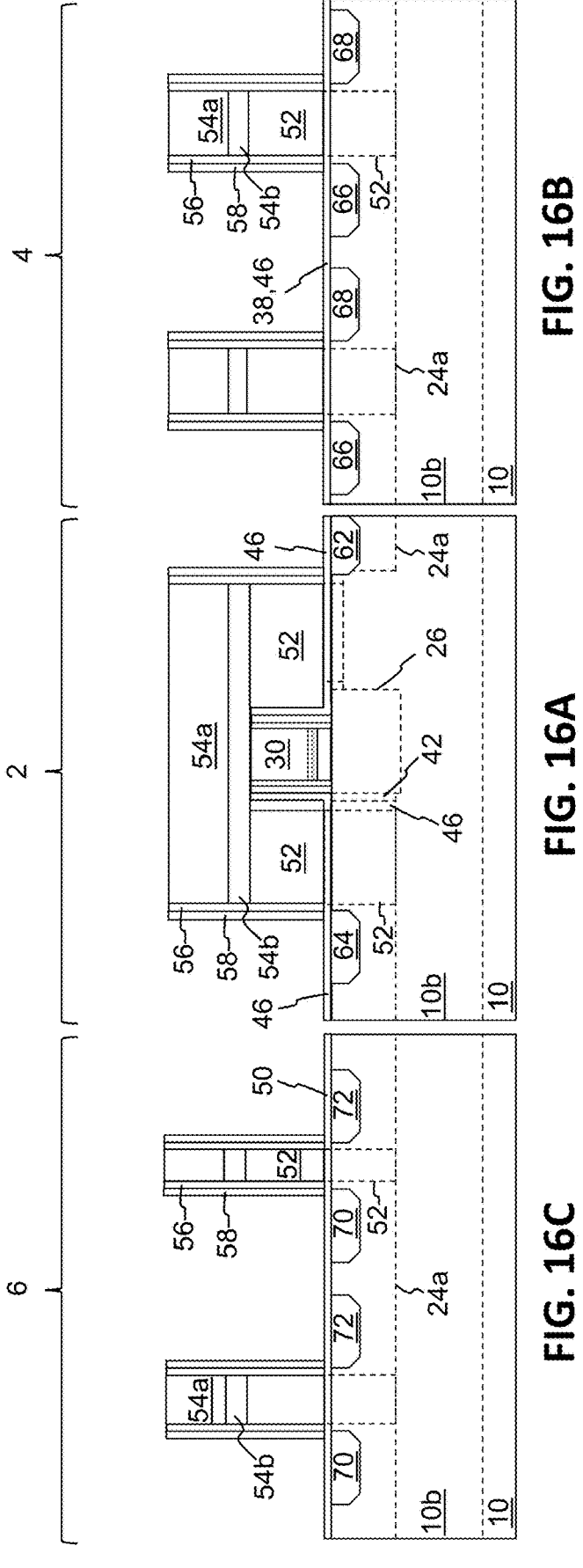

Spacers 56 are formed on the sides of the structures by material deposition and anisotropic etch. An implant can be performed at this time for each of the memory cell area 2, HV device area 4 and logic device area 6 (i.e., by covering the other areas with photoresist and performing an implantation). The upper portions of the fins 10*b* are removed and replaced by an epitaxial film (not shown), which involves an etch to lower the exposed portions of the top surface of the fins 10*b*, followed by epaxial growth. If both PMOS and NMOS devices are formed on the epitaxial film, then the replacement is performed twice, once for the PMOS devices (with the NMOS devices covered by photoresist), and then again for the NMOS devices (with the PMOS devices covered by photoresist). Insulation spacers 58 are formed on the sides of the structures by material deposition and anisotropic etch. Insulation spacers 58 can be single material spacers, or can be multi-material spacers such as ON formed by oxide and nitride deposition, and then nitride anisotropic etch and oxide anisotropic etch. One or more implantations are then performed to form source/drain regions in the exposed areas of the fins 10*b* having a conductivity type different from that of the other portions of the fins 10*b*. Specifically, the one or more implantations form source region 62 and drain region 64 in the memory cell area 2, source region 66 and drain region 68 in the HV device area 4, and source region 70 and drain region 72 in the logic device area 6, as shown in FIGS. 16A-16C.

Figures 17A, 17B, 17C:
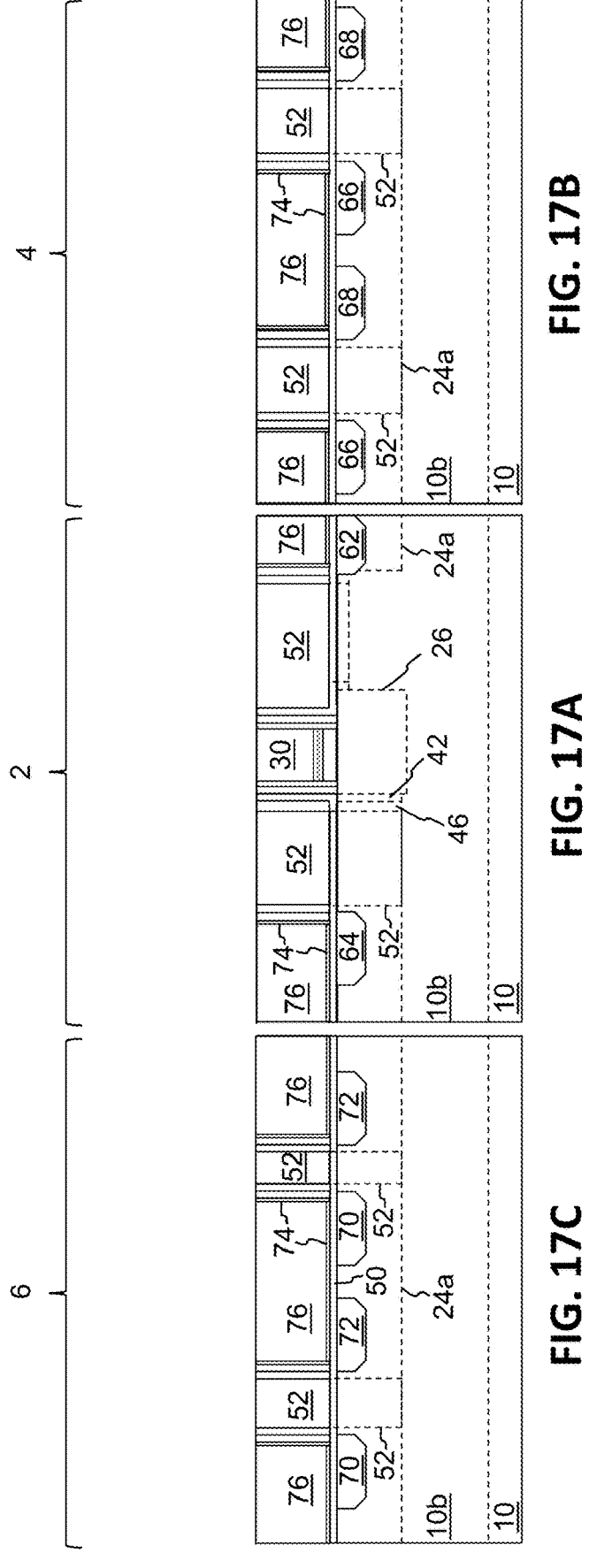

A contact etch stop layer 74 is formed on the structure. Oxide 76 (e.g., inter-layer dielectric (ILD) oxide) is formed over the structure, and subjected to chemical mechanical polish (CMP) planarization using the contact etch stop layer 74 as the polish stop. An etch is used to recess the oxide 76 and hard mask layer 54. Additional oxide layer (not shown) is deposited on the structure (preferably using a high aspect ratio process—HARP). A chemical mechanical polish is then used to planarize the structure, which removes the additional oxide layer and exposes the top surface of the layer of conductive material 52, as shown in FIGS. 17A-17C.

Figures 18A, 18B, 18C:
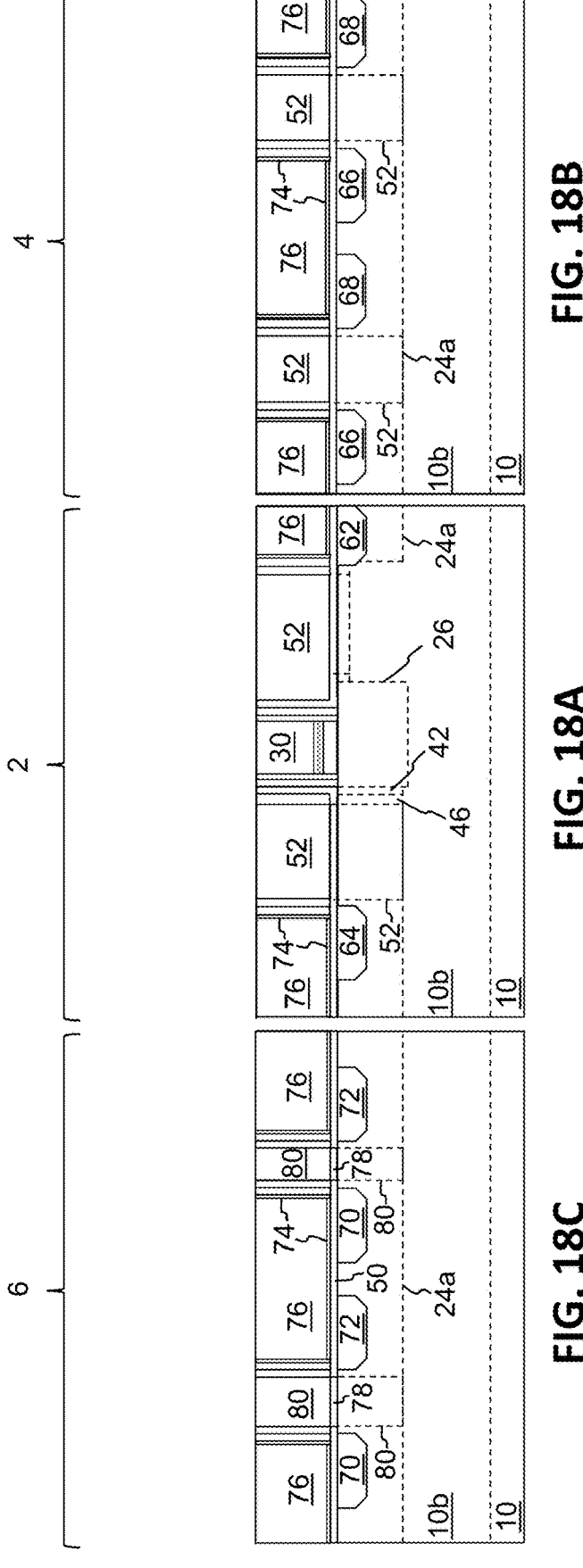
Figures 19A, 19B, 19C:
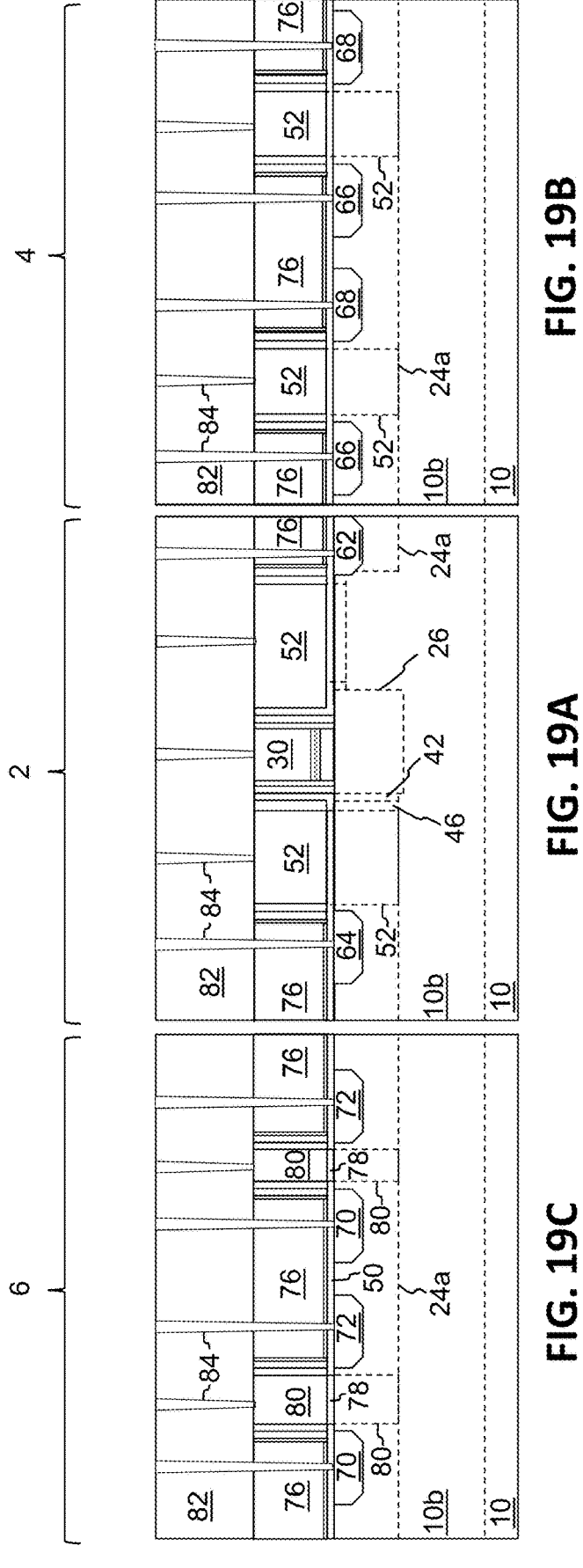

The structure is covered with photoresist, which is partially removed to expose the logic area 6. An etch is used to remove the layer of conductive material 52 in the logic area 6 (i.e., those portions of the layer of conductive material 52 in the logic area 6 served as dummy gates and are removed by this etch), exposing portions of insulation layer 50 underneath. An etch is used to remove the exposed portions of the insulation layer 50, exposing portions of fins 10*b* in the logic area 6. A high K metal gate (HKMG) layer is then formed over the structure, filling the voids left by the removal of the dummy gates of the layer of conductive material 52 and insulation layer 50. The HKMG layer comprises an insulation layer 78 of a high K material (i.e. having a dielectric constant K greater than that of oxide, such as HfO2, ZrO2, TiO2, Ta2O5, or other adequate materials, without limitation) underneath a conductive metal layer 80. A chemical mechanical polish using the oxide 76 as a stop is performed. The resulting structure is shown in FIGS. 18A-18C (after photoresist removal). Oxide 82 is formed over the structure. The oxide 82 is patterned by photolithography to form contact holes extending down to the various components. The contact holes are filled with a conductive material to form contacts 84 that extend through oxide 82/76 to make electrical contact with various components. The final structure is shown in FIGS. 19A-19C.

Figures 20A, 20B, 20C:
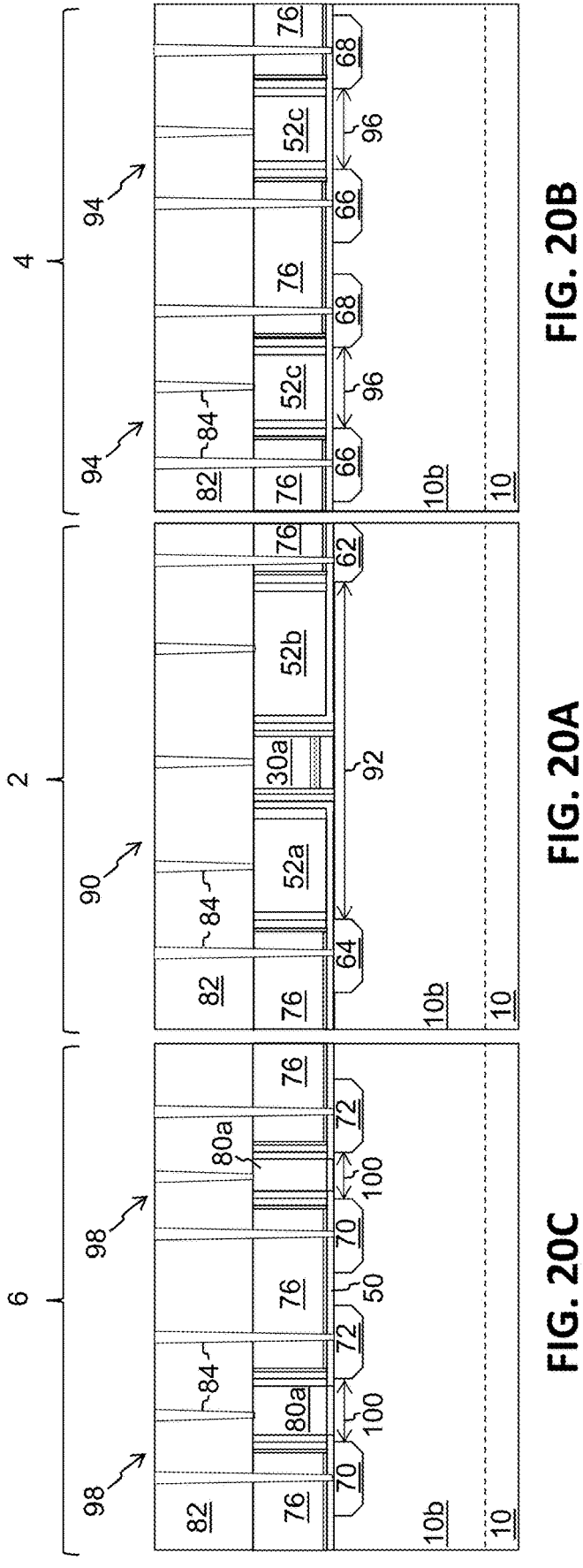
Figures 21A, 21B, 21C:
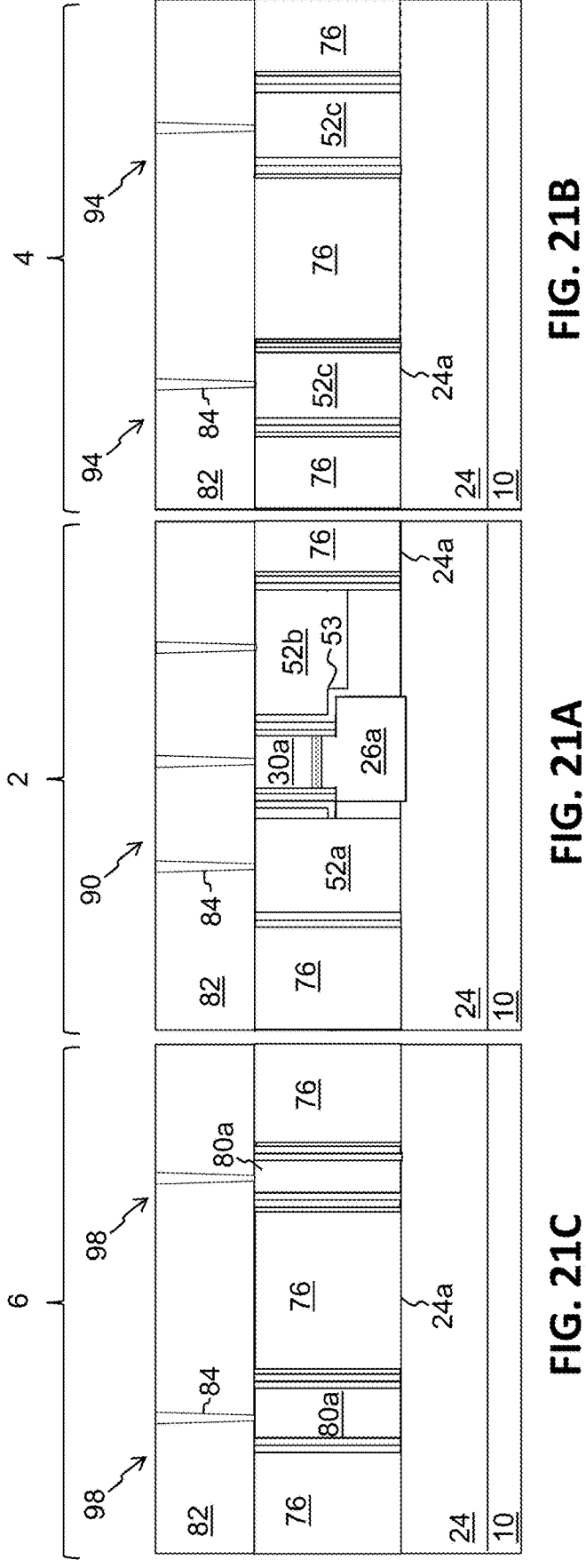
FIG. 21A is a side cross sectional view (between the fins along the column direction) showing the split-gate non-volatile memory cell of the present invention.
FIG. 21B is a side cross sectional view (between the fins along the column direction) showing the HV device of the present invention.
FIG. 21C is a side cross sectional view (between the fins along the column direction) showing the logic device of the present invention.
Figures 22A, 22B, 22C:
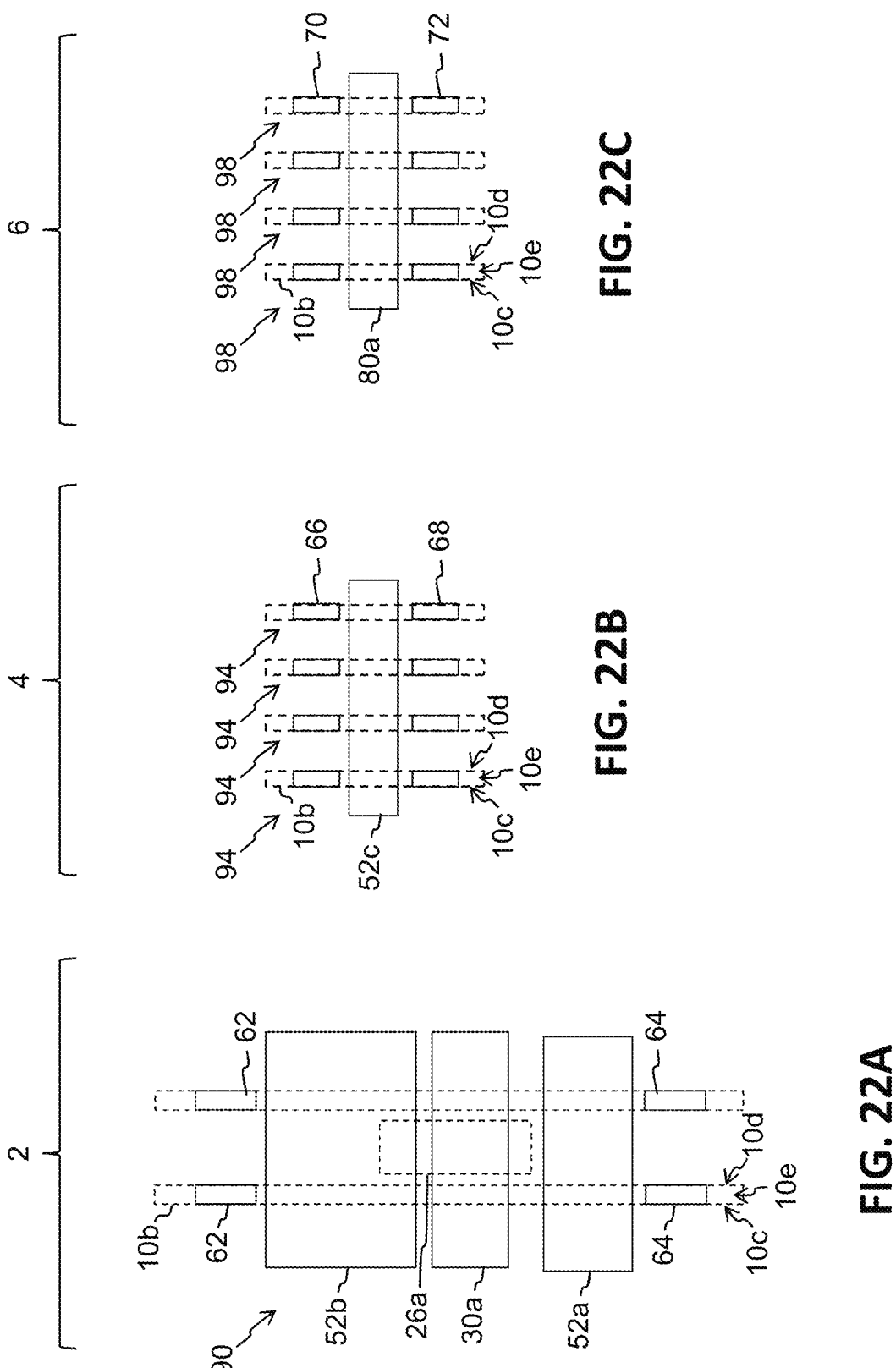
FIGS. 22A-22C are plan views showing the split-gate non-volatile memory cell, the HV device and the logic device of the present invention.

The memory cell 90 formed in the memory cell area 2 is best shown in FIG. 20A (cross section view along the fin 10*b*), FIG. 21A (cross section view between fins 10*b*), and FIG. 22A (plan view). The memory cell 90 is formed on a pair of fins 10*b*, where each of the fins 10*b* includes a source region 62 and a drain region 64, with a channel region 92 of the fin 10*b* extending therebetween. The channel region 92 extends along the side surfaces 10*c*/10*d* and top surface 10*e* of the fins 10*b*. A word line gate 52*a* is that remaining portion of the layer of conductive material 52 that wraps around the top and side surfaces 10*c*/10*d*/10*e* of fins 10*b* adjacent the drain regions 64 (i.e., the word line gate 52*a* has portions that extend along all three surfaces 10*c*/10*d*/10*e* of the fin 10*b* for controlling the conductivity of that portion of the channel region 92 therein). A floating gate 26*a* is the remaining portion of the first block of conductive material 26 that is disposed between the pair of fins 10*b*, and therefore extends along the side surface 10*c* of one of the fins 10*b* and the side surface 10*d* of the other fin 10*b* (for controlling the conductivity of those portions of the channel regions 92 extending along those fin surfaces). A control gate 30*a* is that portion of the strip of conductive material 30 that is disposed over and insulated from the floating gate 26*a*. The erase gate 52*b* is that remaining portion of the layer of conductive material 52 that is laterally adjacent to the floating gate 26*a* (first portion of the erase gate) and disposed partially over the floating gate 26*a* (second portion of the erase gate) and is adjacent the source region 62. The erase gate 52*b* includes a notch 53 that faces an upper edge of the floating gate 26*a* for enhanced erase efficiency. Preferably the two channel regions 92 of the two fins 10*b* on which memory cell 90 is formed are operated in parallel. It should be appreciated that while the figures show a single memory cell 90, multiple memory cells 90 are formed end to end along the pair of fins 10*b* forming a column of memory cells 90, and other columns of memory cells are formed along other fins that extend parallel to fin 10*b* shown in the figures.

The high voltage device 94 formed in the HV device area 4 is best shown in FIG. 20B (cross section view along the fin 10*b*), FIG. 21B (cross section view between fins 10*b*), and FIG. 22B (plan view). The high voltage device 94 is formed along fin 10*b*, which includes a HV source region 66 and a HV drain region 68, with a HV channel region 96 of the fin 10*b* extending therebetween. The HV channel region 96 extends along the side surfaces 10*c*/10*d* and top surface 10*e* of the fin 10*b* between HV source and HV drain regions 66/68. An HV gate 52*c* is formed as the remaining portion of the layer of conductive material 52 that wraps around the top and side surfaces 10*c*/10*d*/10*e* of fin 10*b* between the HV source and HV drain regions 66/68 (i.e., the HV gate 52*c* has portions that extend along all three surfaces 10*c*/10*d*/10*e* for controlling the conductivity of the HV channel region 96 therein). As best shown in FIG. 22B, a plurality of high voltage devices 94 can share a common HV gate 52*c*, whereby the plurality of high voltage devices 94 are operated in parallel.

The logic device 98 formed in the logic device area 6 is best shown in FIG. 20C (cross section view along the fin 10*b*), FIG. 21C (cross section view between fins 10*b*), and FIG. 22C (plan view). The logic device 98 is formed along fin 10*b*, which includes a logic source region 70 and a logic drain region 72, with a logic channel region 100 of the fin 10*b* extending therebetween. The logic channel region 100 extends along the side surfaces 10*c*/10*d* and top surface 10*e* of the fin 10*b* between logic source and logic drain regions 70/72. A logic gate 80*a* is that portion of the conductive metal layer 80 that wraps around the top and side surfaces 10*c*/10*d*/10*e* of fin 10*b* between the logic source and logic drain regions 70/72 (i.e., the logic gate 80*a* has portions that extend along all three surfaces 10*c*/10*d*/10*e* for controlling the conductivity of the logic channel region 100 therein). As best shown in FIG. 22C, a plurality of logic devices 98 can share a common logic gate 80*a*, whereby the plurality of logic devices 98 are operated in parallel.

The above described memory device and the method of its formation has many advantages. By wrapping the logic gate 80*a* around the top and side surfaces 10*c*/10*d*/10*e* of the fin 10*b*, the logic device 98 can be scaled down in size (i.e., because the channel region 100 is folded along the top and side surfaces 10*c*/10*d*/10*e* of fin 10*b*). By wrapping the HV gate 52*c* around the top and side surfaces 10*c*/10*d*/10*e* of the fin 10*b*, the HV device 94 can be scaled down in size (i.e., because the channel region 96 is folded along the top and side surfaces 10*c*/10*d*/10*e* of fin 10*b*). By wrapping the word line gate 52*a* around the top and side surfaces 10*c*/10*d*/10*e* of the fins 10*b*, the performance of the word line gate 52*a* is enhanced and allows for scaling the memory cell 90 down in size (i.e., because the channel regions 92 are folded along the top and side surfaces 10*c*/10*d*/10*e* of the pair of fins 10*b*). The bottom surface of erase gate 52*b* is planar (i.e., it does not wrap around fins 10*b*), which reduces capacitive coupling between the floating gate 26*a* and the erase gate 52*b* for better erase efficiency, and reduces capacitive coupling between the erase gate 52*b* and the source region 62 which increases breakdown voltage. The memory cells 90 and high voltage devices 94 are mostly formed before the logic device metal gate formation, so that the thermal steps used to form the memory cells and high voltage devices do not adversely affect the logic devices. The pitch and spacing of the fins 10*b* in the memory cell area 2 are larger to better accommodate the larger components of the memory cells, while allowing for a greater number of logic devices 98 and high voltage devices 94 formed on fins 10*b* with smaller pitch and spacing.

The word line gates 52*a*, erase gates 52*b* and high voltage gates 52*c* are all formed from the same layer of conductive material, which is also used in the logic device area 6 as dummy material that is eventually replaced with metal logic gates 80*a*, for simplifying the manufacturing process. The memory cell area 2 and HV device area 4 are protected by photoresist during the removal of conductive layer of material 52 from the logic area 6. By having floating gates 26*a* formed between alternating fins 10*b* (i.e., every other fin 10*b*), floating gate to floating gate coupling is avoided. Using metal for the logic gates 80*a* increases performance, while using polysilicon for the word line gates 52*a*, erase gates 52*b*, control gates 30*a* and HV gates 52*c* provides for better tolerance and electron tunneling control. The floating gate 26a is insulated from the fin 10b by insulation layer 25, the word line gate 52a is insulated from the fin 10b by insulation layer 46, the erase gate 52b is insulated from the fin 10b by insulation layer 46, the HV gate 52c is insulated from the fin 10b by insulation layer 38/46, and the logic gate 80a is insulated from the fin 10b by insulation layer 78. By forming each of these insulation layers separately, the performance of the floating gate 26a, word line gate 52a, erase gate 52b, HV gate 52c and logic gate 80a can be individually tuned by selecting different thicknesses and/or compositions for insulation layers 25, 46, 42, 38 and 78. The memory cell 90 is formed on two fins 10b where the programming state of the floating gate 26a controls the conductivity of two channel regions 92 on the two fins 10b, which are operated in parallel so that detected currents in the two channel regions 92 can be summed for better accuracy. The HV devices 94 can each be formed on multiple fins 10b so that multiple channel regions 96 can be operated in parallel for higher current applications. The same is true for the logic devices 98.

FIG. 23 illustrates a first alternate embodiment. Instead of forming first blocks of conductive material 26 (described above with respect to FIGS. 5A and 6A) with a length that is longer than the final length of floating gate 26a, the first blocks of conductive material 26 are initially formed with the desired length of the floating gate 26a, as shown in FIG. 23. By doing so, the etch of the first block of conductive material 26 described above with respect to FIG. 11A can be omitted.

FIGS. 24-25 illustrate a second alternate embodiment, where the formation of photoresist 36 described above with respect to FIG. 10A is omitted, thus causing the top surface 24a of oxide 24 in the eventual location of the erase gate to be recessed as well (see FIG. 24). Then, when the layer of conductive material 52 is formed as described above with respect to FIGS. 14A and 15A, the erase gate 52b extends down around the fin 10b (i.e., making erase gate 52b wrap around the fin 10b, with portions of the erase gate 52b extending along the fin surfaces 10c/10d/10e), as shown in FIG. 25. The advantage of this embodiment is that at least one masking step can be avoided.

Figure 27:
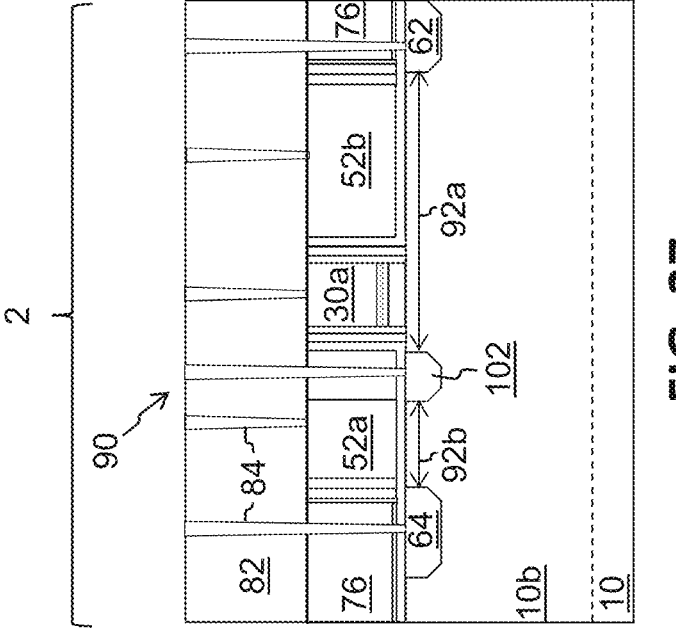
FIGS. 26-27 are side cross sectional views of the memory cell area in a third alternate embodiment of the present invention.
Figure 26:
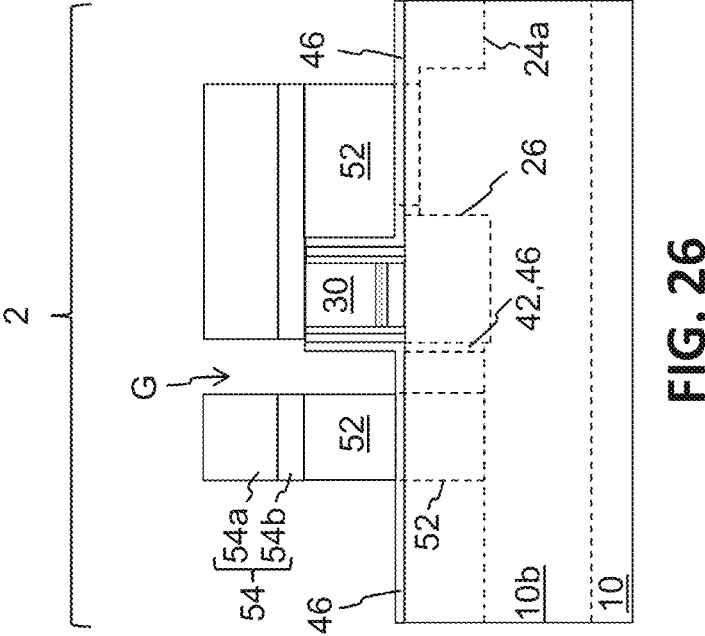

FIGS. 26-27 illustrate a third alternate embodiment, which starts with the same structure in the memory cell area 2 as described above with respect to FIG. 15A, except that hard mask layer 54 is patterned to further expose a portion of the layer of conductive material 52 adjacent the strip of conductive material 30 (on the word line gate side), so that the etch of the layer of conductive material 52 forms a gap G between the strip of conductive material 30 and the remaining portion of the layer of conductive material 52 (on the word line gate side), as shown in FIG. 26. Then, following the above described processing steps for the memory cell area 2, the resulting structure is shown in FIG. 27, where word line gate 52a is spaced further apart from control gate 30a, and another drain region 102 is formed in the fin 10b between the word line gate 52a and the control gate 30a. With this embodiment, each memory cell includes four channel regions across two fins 10b: a first channel region 92a of the first fin 10b extending from source region 62 to drain region 102 (first drain region of the first fin in this embodiment), and a second channel region 92b of the first fin 10b extending from (first) drain region 102 to drain region 64 (second drain region of the first fin in this embodiment), a third channel region 92a of the second fin 10b extending from source region 62 to drain region 102 (first drain region of the second fin in this embodiment), and a fourth channel region 92b of the second fin 10b extending from second drain region 102 to drain region 64 (second drain region of the second fin in this embodiment). Word line gate 52a wraps around and controls the conductivity of the second and fourth channel regions 92b. The word line gate 52a constitutes a first memory transistor. The floating gate 26a, control gate 30a and erase gate 52b constitute a second memory transistor. By splitting the memory cell into two transistors, each of which can be operated independently, it allows for better control of sub-threshold leakage current from unselected cells sharing the same column and improves high temperature read performance and related memory partitioning.

It is to be understood that the present invention is not limited to the embodiment(s) described above and illustrated herein, but encompasses any and all variations falling within the scope of any claims supported thereby. For example, references to the present invention herein are not intended to limit the scope of any claim or claim term, but instead merely make reference to one or more features that may be covered by one or more claims. Materials, processes and numerical examples described above are exemplary only, and should not be deemed to limit any claims. For example, the floating gate could be formed of amorphous silicon instead of polysilicon. Further, not all method steps need be performed in the exact order illustrated. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:
1. A memory device, comprising:
a semiconductor substrate having an upper surface with a plurality of fins, wherein each of the fins extends upwardly and includes first and second side surfaces that oppose each other and that terminate in a top surface;
a memory cell formed on first and second fins of the plurality of fins, comprising:
a first channel region extending along the top surface and first and second side surfaces of the first fin from a source region of the first fin to a first drain region of the first fin for current flow between the source region of the first fin and the first drain region of the first fin, a second channel region extending along the top surface and first and second side surfaces of the first fin from the first drain region of the first fin to a second drain region of the first fin for current flow between the first drain region of the first fin and the second drain region of the first fin, a third channel region extending along the top surface and first and second side surfaces of the second fin from a source region of the second fin to a first drain region of the second fin for current flow between the source region of the second fin and the first drain region of the second fin, a fourth channel region extending along the top surface and first and second side surfaces of the second fin from the first drain region of the second fin to a second drain region of the second fin for current flow between the first drain region of the second fin and the second drain region of the second fin, a floating gate disposed between the first and second fins and extending along a first portion of the first channel region and a first portion of the third channel region, a control gate that extends along and is insulated from the floating gate, an erase gate having a first portion laterally adjacent to the floating gate and a second portion that is disposed over the floating gate, and a word line gate that extends along the second channel region and the fourth channel region, wherein the word line gate extends along and is insulated from the first and second side surfaces and the top surface of the first and second fins for controlling a conductivity of the second channel region from the first drain region to the second drain region of the first fin and for controlling a conductivity of the fourth channel region from the first drain region to the second drain region of the second fin;

a high voltage (HV) device formed on a third fin of the plurality of fins, comprising:

a HV channel region extending along the top surface and first and second side surfaces of the third fin from a HV source region of the third fin to a HV drain region of the third fin for current flow between the HV source region of the third fin and the HV drain region of the third fin, and a HV gate that extends along the HV channel region, wherein the HV gate extends along and is insulated from the first and second side surfaces and the top surface of the third fin; and a logic device formed on a fourth fin of the plurality of fins, comprising:

a logic channel region extending along the top surface and first and second side surfaces of the fourth fin from a logic source region of the fourth fin to a logic drain region of the fourth fin for current flow between the logic source region of the fourth fin and the logic drain region of the fourth fin, and a logic gate that extends along the logic channel region, wherein the logic gate extends along and is insulated from the first and second side surfaces and the top surface of the fourth fin.

2. The memory device of claim 1, wherein the first portion of the erase gate extends along and is insulated from the top surfaces of the first and second fins.

3. The memory device of claim 2, wherein the first portion of the erase gate extends along and is insulated from a second portion of the first channel region and a second portion of the third channel region.

4. The memory device of claim 1, wherein the erase gate includes a notch facing an upper edge of the floating gate.

5. The memory device of claim 1, wherein the first and second fins are taller than the third and fourth fins.

6. The memory device of claim 1, wherein the logic gate includes a metal material, and wherein the logic gate is insulated from the first and second side surfaces and the top surface of the fourth fin by a high K insulation material.

7. The memory device of claim 6, wherein the floating gate, the word line gate, the control gate, the erase gate and the HV gate each include polysilicon material.

8. The memory device of claim 1, wherein the floating gate is disposed adjacent to the second side surface of the first fin for controlling a conductivity of a portion of the first channel region extending along the second side surface of the first fin, and wherein the floating gate is not disposed adjacent to the first side surface of the first fin.

9. The memory device of claim 8, wherein the floating gate is disposed adjacent to the first side surface of the second fin for controlling a conductivity of a portion of the third channel region extending along the first side surface of the second fin, and wherein the floating gate is not disposed adjacent to the second side surface of the second fin.

10. A method of forming a memory device, comprising:

forming a plurality of fins in an upper surface of a semiconductor substrate, wherein each of the fins extends upwardly and includes first and second side surfaces that oppose each other and that terminate in a top surface; and forming a memory cell on first and second fins of the plurality of fins, a high voltage (HV) device on a third fin of the plurality of fins, and a logic device on a fourth fin of the plurality of fins, by:

forming a floating gate between the first and second fins;

forming a control gate over and insulated from the floating gate;

forming a layer of conductive material over the first fin, the second fin, the third fin and the fourth fin, wherein the layer of conductive material is polysilicon;

selectively removing portions of the layer of conductive material, leaving:

a word line gate as a first remaining portion of the layer of conductive material over the first and second fins, an erase gate as a second remaining portion of the layer of conductive material over the first and second fins, wherein the control gate is disposed between the word line gate and the erase gate, a HV gate as a third remaining portion of the layer of conductive material over the third fin, and a dummy gate as a fourth remaining portion of the layer of conductive material over the fourth fin;

forming a source region in the first fin adjacent the erase gate;

forming a first drain region in the first fin adjacent the word line gate;

forming a second drain region in the first fin between the word line gate and the control gate, wherein a first channel region of the first fin extends along the top surface and the first and second side surfaces of the first fin from the source region of the first fin to the second drain region of the first fin, and wherein a second channel region of the first fin extends along the top surface and the first and second side surfaces of the first fin from the first drain region of the first fin to the second drain region of the first fin, wherein the floating gate is disposed adjacent to the second side surface of the first fin for controlling a conduc- tivity of a portion of the first channel region extend- ing along the second side surface of the first fin, and wherein the floating gate is not disposed adjacent to the first side surface of the first fin;

forming a source region in the second fin adjacent the erase gate;

forming a first drain region in the second fin adjacent the word line gate;

forming a second drain region in the second fin between the word line gate and the control gate, wherein a first channel region of the second fin extends along the top surface and the first and second side surfaces of the second fin from the source region of the second fin to the second drain region of the second fin, and wherein a second channel region of the second fin extends along the top surface and the first and second side surfaces of the second fin from the first drain region of the second fin to the second drain region of the second fin, wherein the floating gate is disposed adjacent to the first side surface of the second fin for controlling a conductivity of a portion of the first channel region extending along the first side surface of the second fin, and wherein the floating gate is not disposed adjacent to the second side surface of the second fin;

wherein the word line gate wraps around the first fin such that the word line gate extends along and is insulated from the top and opposing side surfaces of the first fin for controlling a conductivity of the second channel region of the first fin from the first drain region of the first fin to the second drain region of the first fin;

wherein the word line gate wraps around the second fin such that the word line gate extends along and is insulated from the top and opposing side surfaces of the second fin for controlling a conductivity of the second channel region of the second fin from the first drain region of the second fin to the second drain region of the second fin;

forming source and drain regions in the third fin adjacent the HV gate, wherein a channel region of the third fin extends along the top surface and the first and second side surfaces of the third fin from the source region of the third fin to the drain region of the third fin;

forming source and drain regions in the fourth fin adjacent the dummy gate, wherein a channel region of the fourth fin extends along the top surface and the first and second side surfaces of the fourth fin from the source region of the fourth fin to the drain region of the fourth fin; and replacing the dummy gate with a logic gate formed of metal while maintaining the HV gate as the third remaining portion of the layer of conductive mate- rial.

11. The method of claim 10, wherein:

the HV gate wraps around the third fin such that the HV gate extends along and is insulated from the top surface and the first and second side surfaces of the third fin; and the logic gate wraps around the fourth fin such that the logic gate extends along and is insulated from the top surface and the first and second side surfaces of the fourth fin.

12. The method of claim 10, wherein:

the plurality of fins further includes fifth and sixth fins, the fourth fin is disposed between the fifth and sixth fins, the fourth fin is separated from the fifth fin by a first distance, the fourth fin is separated from the sixth fin by the first distance, the first fin is separated from the second fin by a second distance, the second distance is greater than the first distance.

13. The method of claim 12, wherein:

the plurality of fins further includes seventh and eighth fins, the third fin is disposed between the seventh and eighth fins, the third fin is separated from the seventh fin by a third distance, the third fin is separated from the eighth fin by the third distance, the second distance is greater than the third distance.

* * * * *